US012622220B2

(12) United States Patent
Chiu et al.

(10) Patent No.: US 12,622,220 B2
(45) Date of Patent: May 5, 2026

(54) THERMAL PAD FOR ETCH RATE UNIFORMITY

(71) Applicant: Taiwan Semiconductor Manufacturing Co., Ltd., Hsinchu (TW)

(72) Inventors: Chin-Huei Chiu, Taipei (TW); Tsung Fan Yin, Kaohsiung (TW); Chen-Yi Liu, Pingtung (TW); Hua-Li Hung, Hsinchu (TW); Xi-Zong Chen, Tainan (TW); Yi-Wei Chiu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 488 days.

(21) Appl. No.: 17/360,157

(22) Filed: Jun. 28, 2021

(65) Prior Publication Data

US 2021/0327742 A1　　Oct. 21, 2021

Related U.S. Application Data

(60) Division of application No. 16/266,797, filed on Feb. 4, 2019, now Pat. No. 11,049,756, which is a
(Continued)

(51) Int. Cl.
H01L 21/683　　　　(2006.01)
H01J 37/32　　　　(2006.01)
(Continued)

(52) U.S. Cl.
CPC ...... H10P 72/722 (2026.01); H01J 37/32697 (2013.01); H01J 37/32715 (2013.01);
(Continued)

(58) Field of Classification Search
CPC ........... H01L 21/3065; H01L 21/31116; H01L 21/32136; H01L 21/67069; H01L 21/6831;
(Continued)

(56) References Cited

U.S. PATENT DOCUMENTS 5,498,313 A * 3/1996 Bailey ............... H01J 37/32623
118/723 E
6,364,957 B1 * 4/2002 Schneider ........... C23C 16/4585
118/500
(Continued)

FOREIGN PATENT DOCUMENTS

| KR | 100572415 B1 | 4/2006 |
| KR | 100610010 B1 | 8/2006 |
| KR | 20110099181 A | 9/2011 |

*Primary Examiner* — Gordon Baldwin
*Assistant Examiner* — Joshua Reyes
(74) *Attorney, Agent, or Firm* — Slater Matsil, LLP

(57) ABSTRACT

Etch uniformity is improved by providing a thermal pad between an insert ring and electrostatic chuck in an etching chamber. The thermal pad provides a continuous passive heat path to dissipate heat from the insert ring and wafer edge to the electrostatic chuck. The thermal pad helps to keep the temperature of the various components in contact with or near the wafer at a more consistent temperature. Because temperature may affect etch rate, such as with etching hard masks over dummy gate formations, a more consistent etch rate is attained. The thermal pad also provides for etch rate uniformity across the whole wafer and not just at the edge. The thermal pad may be used in an etch process to perform gate replacement by removing hard mask layer(s) over a dummy gate electrode.

20 Claims, 29 Drawing Sheets

Related U.S. Application Data continuation of application No. 15/726,103, filed on Oct. 5, 2017, now Pat. No. 10,199,252.

(60) Provisional application No. 62/527,631, filed on Jun. 30, 2017.

(51) Int. Cl.

| | |
|---|---|
| *H01L 21/3065* | (2006.01) |
| *H01L 21/311* | (2006.01) |
| *H01L 21/3213* | (2006.01) |
| *H01L 21/67* | (2006.01) |
| *H01L 21/687* | (2006.01) |
| *H01L 21/768* | (2006.01) |
| *H10D 30/62* | (2025.01) |
| *H10D 64/01* | (2025.01) |
| *H10P 50/26* | (2026.01) |
| *H10P 50/28* | (2026.01) |
| *H10P 72/00* | (2026.01) |
| *H10P 72/72* | (2026.01) |
| *H10P 72/76* | (2026.01) |
| *H10W 20/00* | (2026.01) |
| *H10P 50/24* | (2026.01) |

(52) U.S. Cl.

CPC ........... *H10D 30/62* (2025.01); *H10D 64/017* (2025.01); *H10P 50/267* (2026.01); *H10P 50/283* (2026.01); *H10P 72/0421* (2026.01); *H10P 72/0432* (2026.01); *H10P 72/72* (2026.01); *H10P 72/7611* (2026.01); *H10W 20/01* (2026.01); *H10W 20/069* (2026.01); *H10P 50/242* (2026.01)

(58) Field of Classification Search

CPC ........... H01L 21/6833; H01L 21/68714; H01L 21/68735; H01L 21/68785; H01L 21/768; H01L 21/76897; H01L 21/823431; H01L 29/66545; H01L 29/66795; H01L 29/785; H01J 37/32623; H01J 37/32642; H01J 37/32697; H01J 37/32715; H01J 37/32724; C23C 16/0227; C23C 16/4585; C23C 16/4586

See application file for complete search history.

(56) References Cited

U.S. PATENT DOCUMENTS

| | | | | |
|---|---|---|---|---|
| 6,466,426 | B1 * | 10/2002 | Mok | H01L 21/68785 |
| | | | | 279/128 |
| 6,583,980 | B1 * | 6/2003 | Wang | H01L 21/6831 |
| | | | | 361/233 |
| 6,723,202 | B2 * | 4/2004 | Nagaiwa | C23C 16/4581 |
| | | | | 118/724 |
| 7,335,278 | B2 | 2/2008 | Koshimizu et al. | |
| 2001/0015262 | A1 * | 8/2001 | Denpoh | H01L 21/67069 |
| | | | | 118/723 R |
| 2002/0029745 | A1 * | 3/2002 | Nagaiwa | H01L 21/67103 |
| | | | | 118/728 |
| 2002/0137352 | A1 | 9/2002 | Nallan et al. | |
| 2004/0261721 | A1 * | 12/2004 | Steger | H01L 21/6831 |
| | | | | 118/728 |
| 2004/0261946 | A1 * | 12/2004 | Endoh | H01J 37/32642 |
| | | | | 156/345.1 |
| 2006/0016561 | A1 * | 1/2006 | Choi | H01J 37/32623 |
| | | | | 156/915 |
| 2006/0171094 | A1 | 8/2006 | Muka et al. | |
| 2007/0139856 | A1 * | 6/2007 | Holland | H01L 21/67103 |
| | | | | 361/234 |
| 2007/0295455 | A1 | 12/2007 | Mui et al. | |
| 2008/0006207 | A1 * | 1/2008 | Miyagawa | H01J 37/32642 |
| | | | | 118/724 |
| 2008/0239691 | A1 * | 10/2008 | Miyagawa | H01L 21/67103 |
| | | | | 165/185 |
| 2010/0040768 | A1 * | 2/2010 | Dhindsa | H01L 21/67069 |
| | | | | 427/248.1 |
| 2010/0326957 | A1 | 12/2010 | Maeda et al. | |
| 2011/0247759 | A1 | 10/2011 | Kitajima et al. | |
| 2011/0315318 | A1 * | 12/2011 | Kobayashi | H01J 37/3244 |
| | | | | 427/180 |
| 2012/0247954 | A1 * | 10/2012 | Yamawaku | H01J 37/32091 |
| | | | | 204/298.31 |
| 2014/0034242 | A1 * | 2/2014 | Sant | H01J 37/32605 |
| | | | | 29/458 |
| 2014/0065835 | A1 | 3/2014 | Kadkhodayan et al. | |
| 2014/0146434 | A1 | 5/2014 | Uchida | |
| 2014/0235063 | A1 * | 8/2014 | McMillin | H01J 37/32642 |
| | | | | 438/716 |
| 2015/0114567 | A1 * | 4/2015 | Nagayama | H01J 37/32091 |
| | | | | 156/345.52 |
| 2015/0170942 | A1 | 6/2015 | Chhatre et al. | |
| 2016/0042926 | A1 * | 2/2016 | Ishikawa | H01J 37/32522 |
| | | | | 118/723 R |
| 2016/0329210 | A1 | 11/2016 | Mao et al. | |
| 2017/0002465 | A1 * | 1/2017 | Shaikh | H01J 37/32623 |
| 2017/0352566 | A1 | 12/2017 | Ramaswamy et al. | |
| 2019/0385891 | A1 * | 12/2019 | Chang | H01L 21/68757 |

* cited by examiner

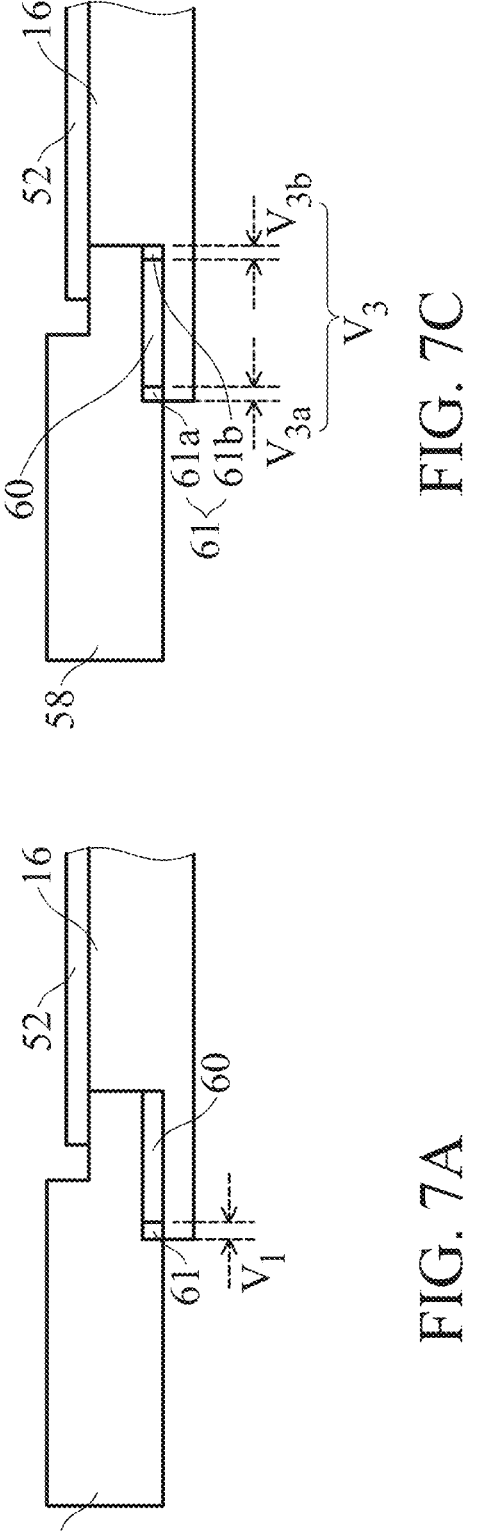
FIG. 7A
FIG. 7C
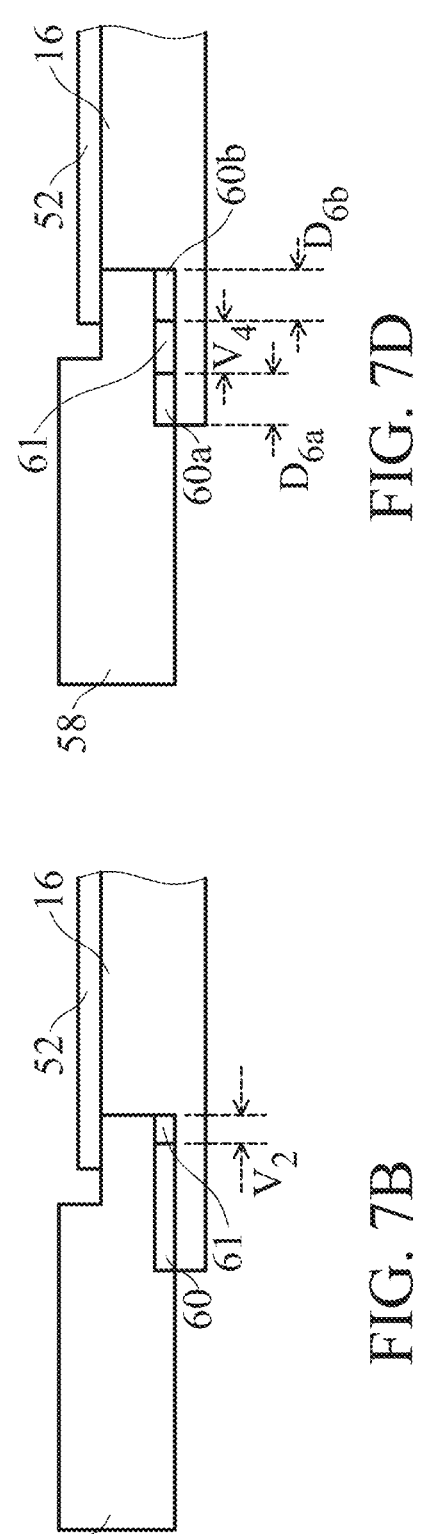
FIG. 7B
FIG. 7D

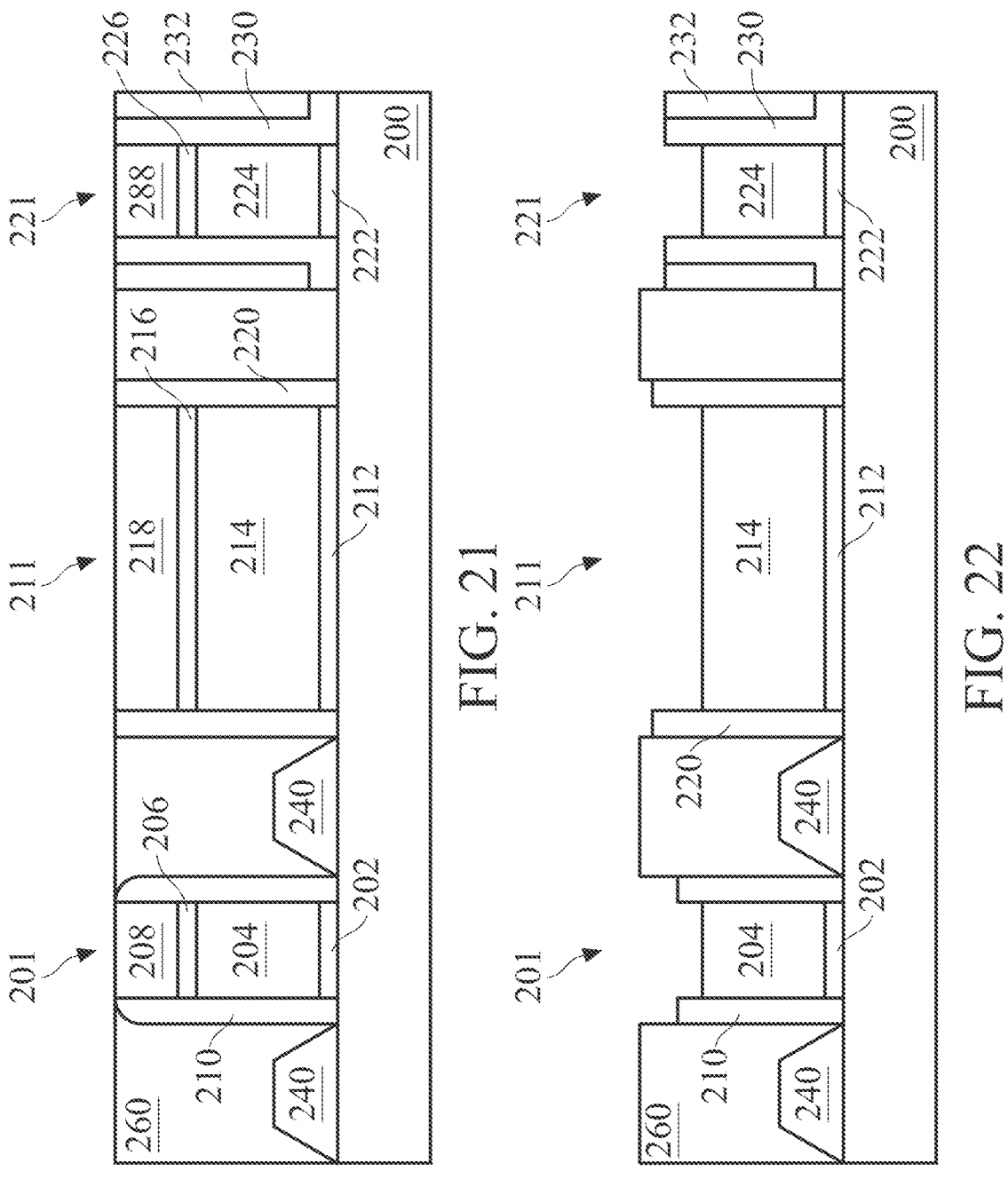

THERMAL PAD FOR ETCH RATE UNIFORMITY

PRIORITY CLAIM AND CROSS-REFERENCE

This application is a divisional of U.S. application Ser. No. 16/266,797, filed on Feb. 4, 2019, which is a continuation of U.S. application Ser. No. 15/726,103, filed on Oct. 5, 2017, now U.S. Pat. No. 10,199,252, issued on Feb. 5, 2019, which claims priority to and the benefit of U.S. Provisional Application No. 62/527,631, filed on Jun. 30, 2017, entitled "Thermal Pad for Etch Rate Uniformity," which applications are hereby incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFETs) were thus developed. The Fin-FETs include vertical semiconductor fins. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins.

In the replacement of dummy gates used in a gate-last fabrication, hard mask layer(s) of nitrides and/or oxides may be formed over a dummy gate electrode, such as polysilicon. Replacing the dummy gate can involve etching the hard masks, however, due to gate loading effects gate heights may have different heights and widths. Etching the hard masks may cause shortening of some of the gates, due in part to gate loading and etch rate variations in the etching chamber.

In a plasma etching process, a gas is first introduced into a reaction chamber and then plasma is generated from the gas. This is accomplished by dissociation of the gas into ions, free radicals and electrons by using an RF (radio frequency) generator, which includes one or more electrodes. The electrons are accelerated in an electric field generated by the electrodes, and the energized electrons strike gas molecules to form additional ions, free radicals and electrons, which strike additional gas molecules, and the plasma eventually becomes self-sustaining. The ions, free radicals and electrons in the plasma react chemically with the layer material on the semiconductor wafer to form residual products which leave the wafer surface and, thus, etch the material from the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6B and 7A-7E illustrate a thermal pad configuration, in accordance with some embodiments.

FIGS. 20-26 illustrate various intermediate steps in the formation of a semiconductor device using a thermal pad, in accordance with some embodiments.

FIGS. 28A through 30B illustrate topographical maps of wafer gate heights and hard mask thicknesses at various stages of an etch process using a thermal pad, in accordance with some embodiments.

DETAILED DESCRIPTION

Figure 1:
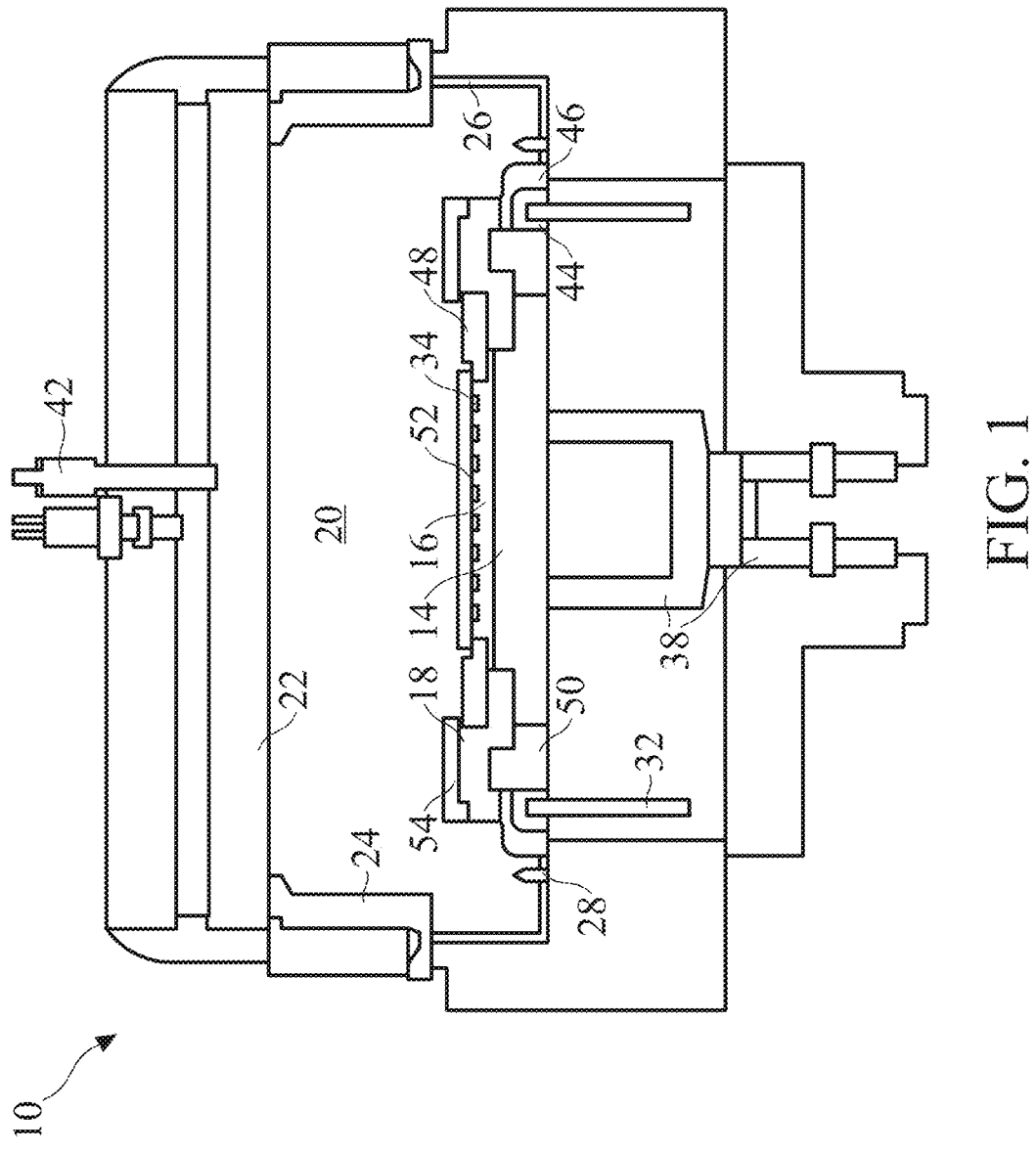
FIG. 1 illustrates an etching chamber, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provide temperature control at the edge of a wafer in a dry etch process to provide a more consistent etch rate. In a dry etch process, an electrostatic chuck holds a wafer in a process etching chamber. Etchant gasses are provided in the chamber and a plasma is created by an RF generator and controlled with a voltage bias. A number of factors may affect etch rate at any particular point on the wafer. For example, the location and availability of etchant gasses varies throughout the etch process. Temperature affects etch rate as well. In some instances, etch rate decreases as temperature increases. While the underside of the electrostatic chuck may have cooling pipes, the edge of the wafer overlaps the edge of the electrostatic chuck platform to protect the electrostatic chuck from etchant processes. An insert ring is located at a periphery of the electrostatic chuck and holds the edge of the wafer. As a result of this arrangement, the temperature at the edge of the wafer may be higher than the temperature towards the center of the wafer. During an idle chamber time, the heat retained in the insert ring may transfer to the wafer edge, causing the wafer edge to not cool as quickly as the center of the wafer. As a result when etching resumes, the heat retained in the wafer edge may inhibit etch rate in the wafer edge regions.

When a wafer is etched under such a configuration, the hotter temperature at the edge of the wafer results in a lower etch rate at the edge of the wafer. This is undesirable because extended etching times used to fully etch the edge portions of the wafer may cause interior portions of the wafer to etch more than desired. Also, if the material to be etched is already thicker at the edge of the wafer due to process variations, the problem is further exacerbated and a resulting difference in the height of structures before and after etching may be worse than prior to etching.

As described in detail below, a thermal pad is placed between the insert ring and the electrostatic chuck to dissipate heat from the wafer edge through the insert ring into the electrostatic chuck. As a result, as described below a wafer may be etched in a more consistent manner and provide loading uniformity across multiple structures.

FIG. 1 illustrates an etching chamber 10. An electrostatic chuck 16 is shown on top of a cathode 14. The etching chamber 10 is equipped with a coil antenna (not shown) as a plasma source in a reaction chamber 20 which has a ceiling block 22, a dome-shaped sidewall 24, a chamber wall liner 26, and the electrostatic chuck 16. The dome-shaped sidewall 24 and the chamber wall liner 26 may be made of quartz. The chamber wall liner 26 may be equipped with an opening for the passage of a wafer paddle (not shown) in loading and unloading wafers. It may be removed from the etching chamber 10 for cleaning.

A shadow ring 18 is positioned inside the reaction chamber 20 which can be lifted up to a process position by lifting pins 32. The lifting pins 32 lift the shadow ring 12 away from the wafer 52 when a wafer is being loaded or unloaded. Cooling gas channels 34 are provided inside the electrostatic chuck 16 near its top surface. A high heat conductivity gas such as helium can be circulated through the cooling gas channels 34 to provide a suitable gas on the bottom side of wafer 30 for transferring heat away from the wafer to the electrostatic chuck 16 during an etch process. The electrostatic chuck 16 may also be water cooled which is not shown. The electrostatic chuck 16 is aligned by an electrostatic chuck collar 38. Etching gas is fed into reaction chamber 20 through gas inlets 28. A thermocouple 42 is mounted in the ceiling block 22 for monitoring temperature.

The shadow ring 18 may comprise a ceramic material such as quartz ($SiO_2$) for its high temperature stability. However, when quartz is bombarded by plasma ions, oxygen atoms may release from the quartz and become a contamination hazard. The quartz ring may be topped by a silicon insert ring 48 and by a silicon top collar ring 54 which may alleviate or minimize contamination issues and protect the shadow ring 18 from build-up of etching byproducts.

An insulating ring 50 surrounds the cathode 14 for electrical isolation. Base members 44 and 46 provide platform support.

Figure 2:
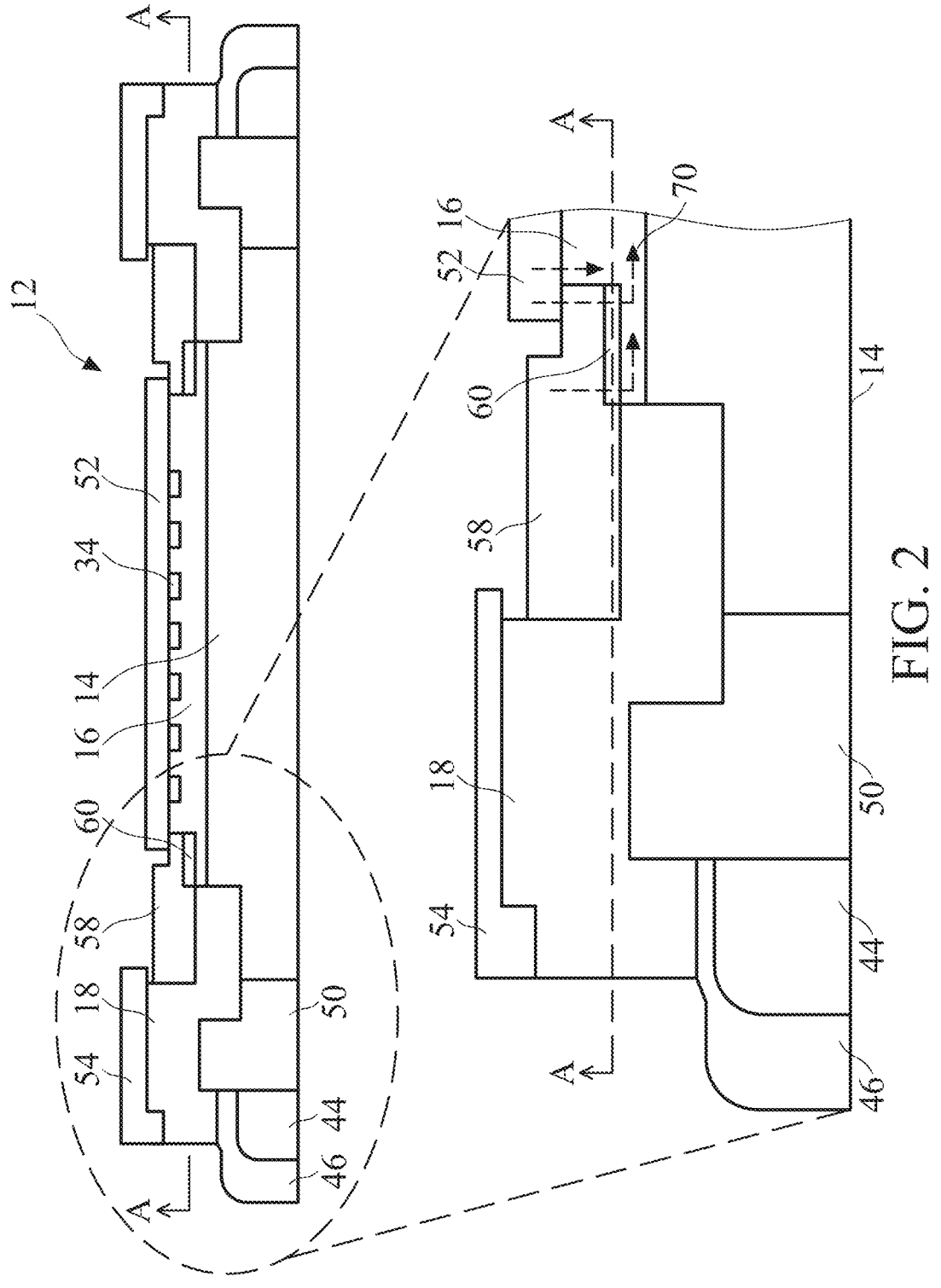
FIG. 2 illustrates a platform of an etching chamber, in accordance with some embodiments.

FIG. 2 illustrates the platform portion of an etching chamber that holds the wafer, in accordance with some embodiments. FIG. 2 also illustrates a magnified portion of the platform. Like elements are labeled as discussed above with respect to FIG. 1. The shadow ring 18 is stepped on the inside top surface (toward the center of the ring) to provide a receiving portion for the insert ring 58, which is positioned on the step and covers the step. The shadow ring 18 may also be stepped on the outside top surface (away from the center of the ring) to provide a receiving portion for the top collar ring 54. The top collar ring 54 may be comprised of silicon and may provide protection of the shadow ring 18 from plasma etching. The shadow ring 18 also interfaces with the insulating ring 50 and the cathode 14. The insulating ring 50 may be made of any appropriate insulating material for electrical isolation. The shadow ring 18 is movable by lifting pins 32 (see FIG. 1) for loading and unloading of the wafer 52.

The magnified call out illustrates a thermal pad 60 positioned between the insert ring (or focus ring) 58 and the electrostatic chuck 16. The thermal pad 60 provides for thermal dissipation from the wafer 52 and insert ring 58 through the thermal pad 60 to the electrostatic chuck 16. Because the electrostatic chuck 16 may have cooling mechanisms built in (e.g., water cooling and/or gas cooling channels), the heat dissipation from the electrostatic chuck 16 can more efficiently be used to dissipate heat from the edge of the wafer 52 and the insert ring 58. The composition and fabrication of the thermal pad will be discussed further below.

One benefit for dissipating heat from the wafer 52 edge, as discussed above, is that the etch rate for devices on the edge of the wafer 52 can be made more uniform to the etch rate for devices in the center of the wafer 52. The etch rate can also be affected by a number of other factors. For example, if the insert ring 58 is made of silicon, plasma etchant can be attracted to the silicon of the insert ring and reduce the etch rate at the edge of the wafer. Accordingly, increasing the etch rate of the edge portions of the wafer 52 by other means is desirable.

Figure 3:
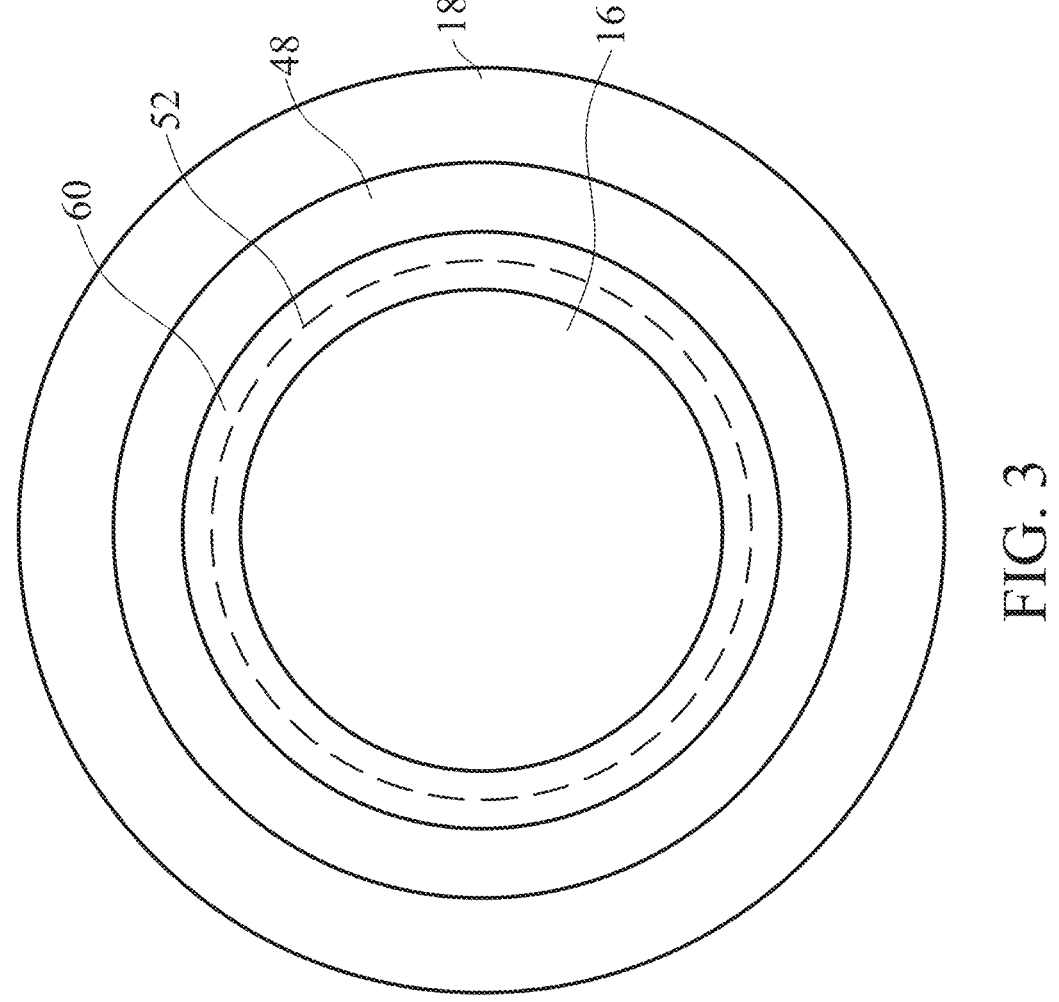
FIGS. 3-5 illustrate top down views of a cross-section of an etching platform, in accordance with various embodiments.

FIG. 3 illustrates a top-down cross-sectional view through the cut line A-A of FIG. 2, in accordance with some embodiments. The electrostatic chuck 16 is in the center and supports a wafer 52 (represented in phantom by the dashed circle). The thermal pad 60 is positioned between a stepped lip of the electrostatic chuck 16 and a stepped receiving portion of the insert ring 58. The insert ring 58 interfaces with shadow ring 18. As can be seen in FIG. 3, the thermal pad 60 is provided as a single continuous ring of material.

Figure 4:
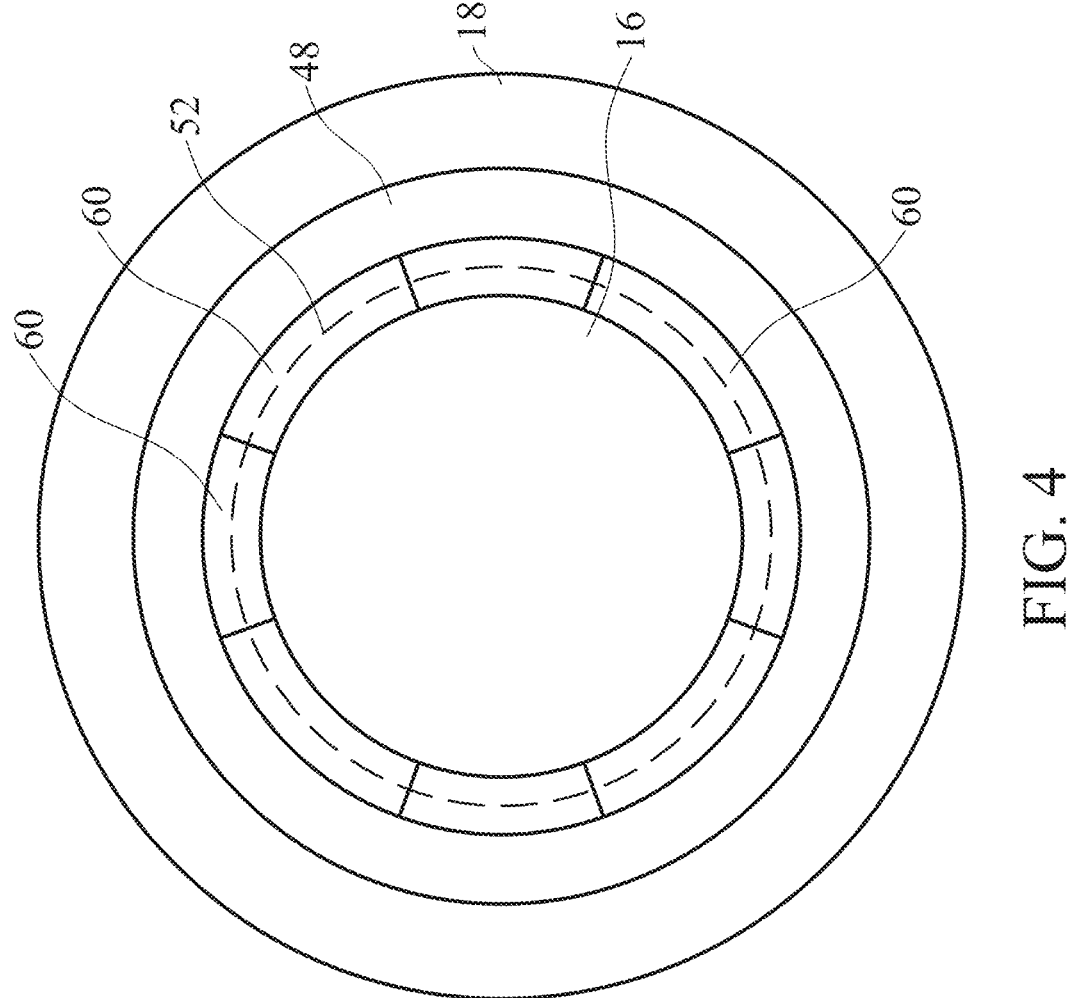

FIG. 4 illustrates a top-down cross-sectional view through the cut line A-A of FIG. 2, in accordance with some embodiments. The embodiment of FIG. 4 is similar to that of FIG. 3, except that the thermal pad 60 is provided as multiple segments which fit together to form a substantially gapless ring.

Figure 5:
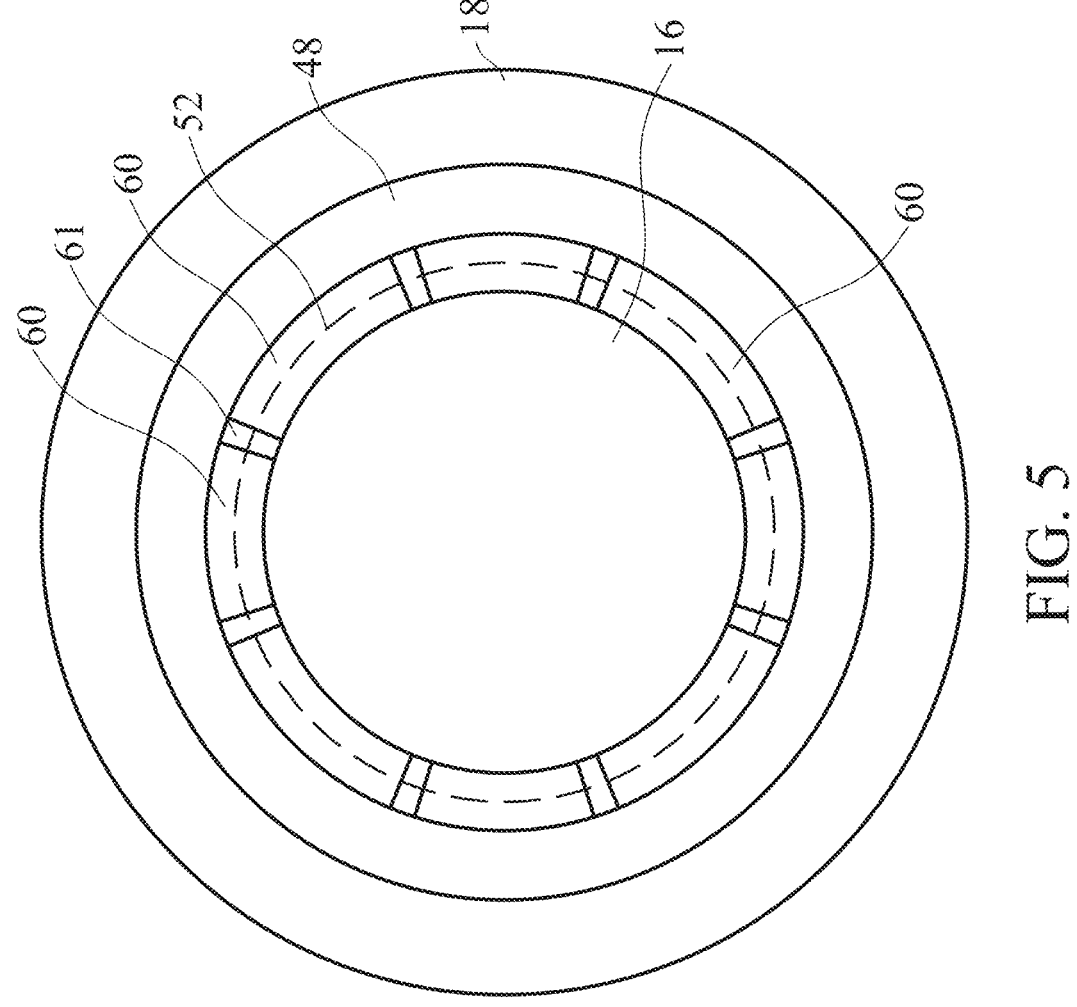

FIG. 5 illustrates a top-down cross-sectional view through the cut line A-A of FIG. 2, in accordance with some embodiments. The embodiment of FIG. 5 is similar to that of FIG. 3, except that the thermal pad 60 is provided as multiple segments which fit together to form a ring which may have a number of voids 61 between thermal pad segments.

Figure 6A:
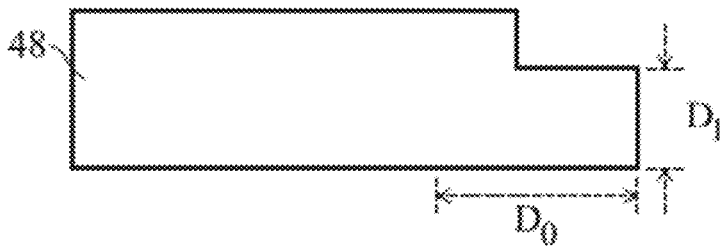
Figure 6B:
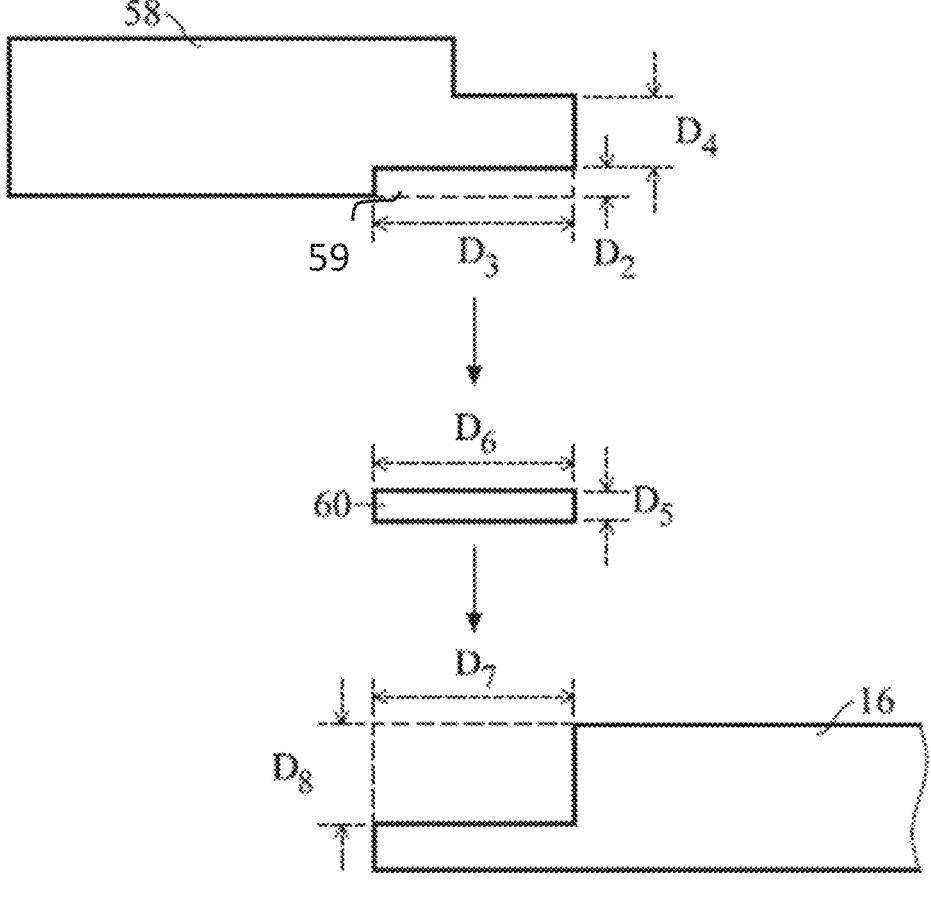

FIGS. 6A and 6B illustrate a process overview of positioning a thermal pad 60 between an insert ring 58 and electrostatic chuck 16 of an etching chamber. FIG. 6A illustrates an insert ring 48 prior to modification to accept the thermal pad 60. In some embodiments the insert ring 48 is not modified, but instead a new insert ring (such as insert ring 58) fabricated with the appropriate interfacial elements to accept the thermal pad 60. The insert ring 48 has a step height $D_1$ which corresponds to a step height $D_8$ of the electrostatic chuck 16. The insert ring 48 has a step width Do which corresponds to about the step width $D_7$ of the electrostatic chuck 16. The bottom surface of insert ring 48 may be substantially planar. In some embodiments the insert ring 48 step height $D_1$ is between about 3.5 and about 4.5 mm or between about 3.95 and about 4.15 mm, such as about 4.05 mm. In some embodiments the insert ring 48 step width Do is between about 6 and about 7 mm or between about 6.4 and about 6.6 mm, such as about 6.5 mm. Other dimensions may be used and generally depend on the dimensions of the electrostatic chuck 16 step.

In FIG. 6B, the insert ring 48 is modified to become the insert ring 58. In some embodiments, the insert ring 48 is fabricated and as part of fabrication modified to become the insert ring 58. In such embodiments, insert ring 48 can be used as is or further processed into insert ring 58. In some embodiments, insert ring 58 is fabricated to replace insert ring 48 in a wafer etching apparatus.

Modifying insert ring 48 may include mechanically grinding or laser cutting a step out of the bottom side of the insert ring 48 by removing material from the insert ring 48. Other suitable processes may be used to remove material from the insert ring. The dimensions of the step 59 created include a bottom step height $D_2$ and a bottom step width $D_3$. The bottom step height $D_2$ may be selected based on the thickness of the thermal pad 60. The bottom step width $D_3$ may be selected based on the width of the thermal pad 60. The remaining center step height $D_4$ is about equal to the initial step height $D_1$ minus the bottom step height $D_2$. The bottom step width $D_3$ may be about the same or larger than the insert ring 48 step width Do. In some embodiments the bottom step height $D_2$ is between about 0.4 and about 0.6 mm, such as about 0.5 mm. In some embodiments the bottom step width $D_3$ is between about 6 and about 7 mm or between about 6.4 and about 6.5 mm, such as about 6.5 mm. In some embodiments the center step height $D_4$ is between about 3 and about 4 mm or between about 3.4 and about 3.6 mm, such as about 3.5 mm. Other dimensions may be used and generally depend on the dimensions of the electrostatic chuck 16 step.

Thermal pad 60 has a thickness $D_5$ and a width $D_6$. The thickness $D_5$ may correspond to the bottom step height $D_2$. In some embodiments where the thermal pad 60 includes a compressible material or adhesive, the thermal pad 60 may have a thickness $D_5$ which is slightly larger than the bottom step height $D_2$. In some embodiments where the thermal pad 60 does not include a compressible material or adhesive, the thickness $D_5$ may be slightly smaller than the bottom step height $D_2$ to account for a later applied adhesive. The width $D_6$ of the thermal pad 60 may be less than or equal to the bottom step width $D_3$.

The thermal pad 60 may be a conformable material suitable to fill the bottom step of the insert ring 58. The thermal pad 60 may be a thermally conductive material to conduct heat away from the insert ring 58 and wafer 52. In some embodiments, the thermal pad 60 is formed of a silicone-based thermal interface material produced by Shin-Etsu Chemical. These materials may, for example, comprise an elastomer with metallic fillers. Other materials, such as a thermal interface material or a polymer may also be used. In some embodiments, the thermal pad 60 is formed of a silicone resin cast in a mold. In such embodiments, the silicone resin may include a metallic filler to improve thermal conductivity. In some embodiments, the filler material may include a metallic oxide or nitride, such as aluminum oxide, aluminum nitride, copper oxide, beryllium oxide, iron oxide, and so forth. In some embodiments, the filler material may include a metal or composite, such as silver, copper, aluminum, titanium, magnesium, gold, and so forth, or combinations thereof. In some embodiments, the composition of the thermal pad 60 includes carbon, oxygen, aluminum, and silicon.

The thermal pad 60 has a higher thermal conductivity than other elements of the etching chamber 10 which are in contact with the insert ring 58. In some embodiments, the thermal pad 60 has a thermal conductivity between about 4 and 6, such as about 5 W/m·K.

The electrostatic chuck 16 has a step with a height $D_8$ and a width $D_7$. In some embodiments the step height $D_8$ is between about 4.1 and about 4.3 mm, such as about 4.2 mm. In some embodiments the step width $D_7$ is between about 6.55 and about 6.65 mm, such as about 6.6 mm. Other dimensions may be used and generally depend on the dimensions of the electrostatic chuck 16 step.

The thermal pad 60 may comprise a material having a tackiness on its surfaces and can be mounted to either the electrostatic chuck 16 or the insert ring 58. In some embodiments, an adhesive (not shown) can be added to the thermal pad 60 or the mating surface of the electrostatic chuck 16 or insert ring 58 to mount the thermal pad 60. In some embodiments, the adhesive may have thermally conductive characteristics. In some embodiments, the thermal pad 60 may be removed by physical force, such as by peeling or scraping the thermal pad 60 away from the insert ring 58 or electrostatic chuck 16. In some embodiments, an adhesive can be released, such as by exposing the adhesive to a release agent, UV light, or suitable temperature to break down the adhesive, allowing removal of the thermal pad 60.

After mounting the thermal pad 60, the insert ring 58 may be reinstalled and the top collar ring 54 reinstalled.

FIGS. 7A, 7B, 7C, and 7D illustrate various embodiments of the thermal pad 60 showing different arrangements of the thermal pad 60. In FIG. 7A, the width ($D_6$ of FIG. 6B) of the thermal pad 60 is less than the width ($D_3$ of FIG. 6B) of the bottom step of the insert ring 58. The thermal pad 60 interfaces with the sidewall of the electrostatic chuck 16. A void 61 is created between the insert ring 58 and thermal pad 60 at the outside side of the thermal pad 60. The void 61 may have a width $V_1$ which is about 0 to 12% of the width $D_3$ (see FIG. 6B), such as about 9 to 10%, such as 9.38% or about 9.5%.

In FIG. 7B, the thermal pad 60 is similar to the thermal pad 60 of FIG. 7A, however thermal pad 60 is positioned to have a sidewall interface with the insert ring 58 and a void 61 is created between the thermal pad 60 and the electrostatic chuck 16 at the inside side of the thermal pad 60. The void 61 may have a width $V_2$ which is about 0 to 12% of the width $D_3$ (see FIG. 6B), such as about 9 to 10%, such as 9.38% or about 9.5%.

In FIG. 7C, the thermal pad 60 is similar to the thermal pad 60 of FIG. 7A, however thermal pad 60 is positioned such that a void 61a occurs on one side of the thermal pad 60 and a void 61b occurs on the other side of the thermal pad 60. The void 61a may have a width $V_{3a}$ which is about 0 to 6% of the width $D_3$ (see FIG. 6B), such as about 4 to 5%, such as 4.69% or about 4.5%. The void 61b may have a width $V_{3b}$ which is about 0 to 6% of the width $D_3$ (see FIG. 6B), such as about 4 to 5%, such as 4.69% or about 4.5%. The total void 61 may have total width, $V_3 = V_{3a} + V_{3b}$, which is about 0 to 12% of the width $D_3$ (see FIG. 6B), such as about 9 to 10%, such as 9.38% or about 9.5%.

In FIG. 7D, the thermal pad 60 is shown as two separate thermal pads 60a and 60b. Thermal pad 60a has a sidewall interface with insert ring 58. Thermal pad 60b has a sidewall interface with electrostatic chuck 16. A void 61 occurs between thermal pad 60*a* and thermal pad 60*b*. The void 61 may have a width $V_4$ which is about 0 to 40% of the width $D_3$ (see FIG. 6B), such as about 30%. The thermal pad 60*a* may have a width $D_{6a}$ which is about 0 to 45% of the width $D_6$ (see FIG. 6B), such as about 35%. The thermal pad 60*b* may have a width $D_{6b}$ which is about 0 to 45% of the width $D_6$ (see FIG. 6B), such as about 35%. Although two thermal pads 60*a* and 60*b* are shown, it should be understood that more than two thermal pads 60 may be provided.

Figure 7E:
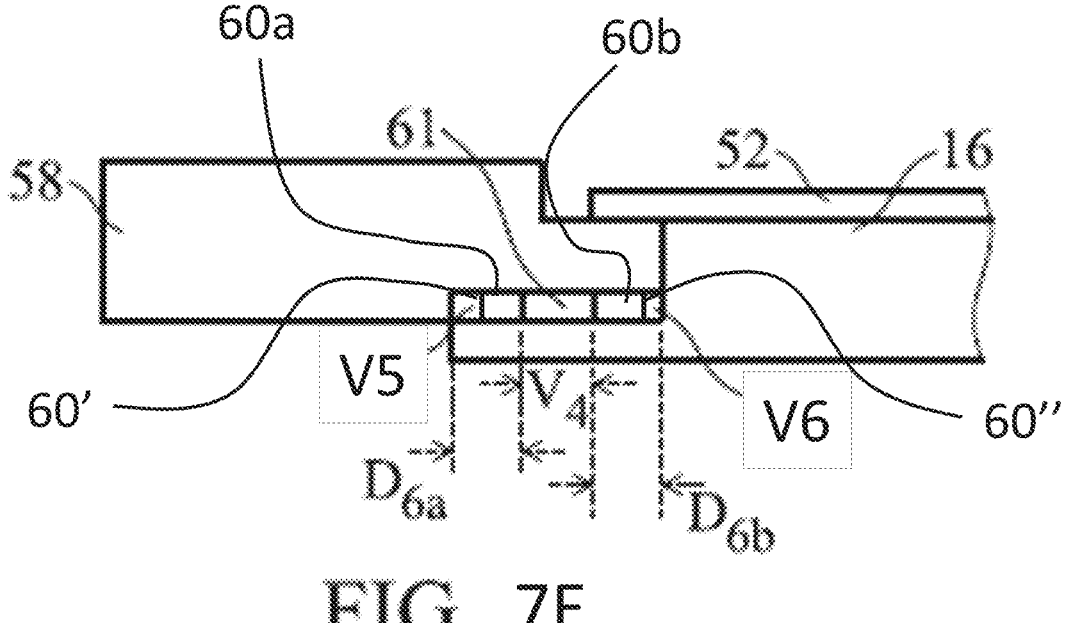

It should be understood that embodiments of FIG. 7D can be combined with aspects of the embodiments of FIGS. 7A, 7B, and 7C. For example, the embodiment of FIG. 7D can be combined with the embodiment of FIG. 7C to provide a void 61 on both sides of thermal pad 60*a* and on both sides of thermal pad 60*b*. FIG. 7E illustrates one such embodiment, including a void V5 at a side, 60', of thermal pad 60*a*, and a void V6 at a side, 60", of thermal pad 60*b*, as well as void V4 between thermal pads 60*a* and 60*b*. It should also be understood that any of the embodiments of FIGS. 7A, 7B, 7C, and 7D (or combinations thereof) may be combined with the embodiments of FIGS. 3, 4, and 5 to provide continuous ringed thermal pads 60 of FIG. 3 or segmented thermal pads 60, such as illustrated in FIGS. 4 and 5. As an example, FIG. 7E illustrates a first thermal pad 60*a* and a second thermal pad 6*ob* with a first void V5 between ring 58 and a surface 60' of first thermal pad 60*a*, and a second void V6 between electrostatic chuck 16 and a surface of second thermal pad 60*b*.

In some embodiments, the void(s) 61 of FIGS. 7A, 7B, 7C, and 7D, may be filled with ambient air or another gas, such as helium. In some embodiments, the void 61 may be filled with a thermal interface material.

Figure 8:
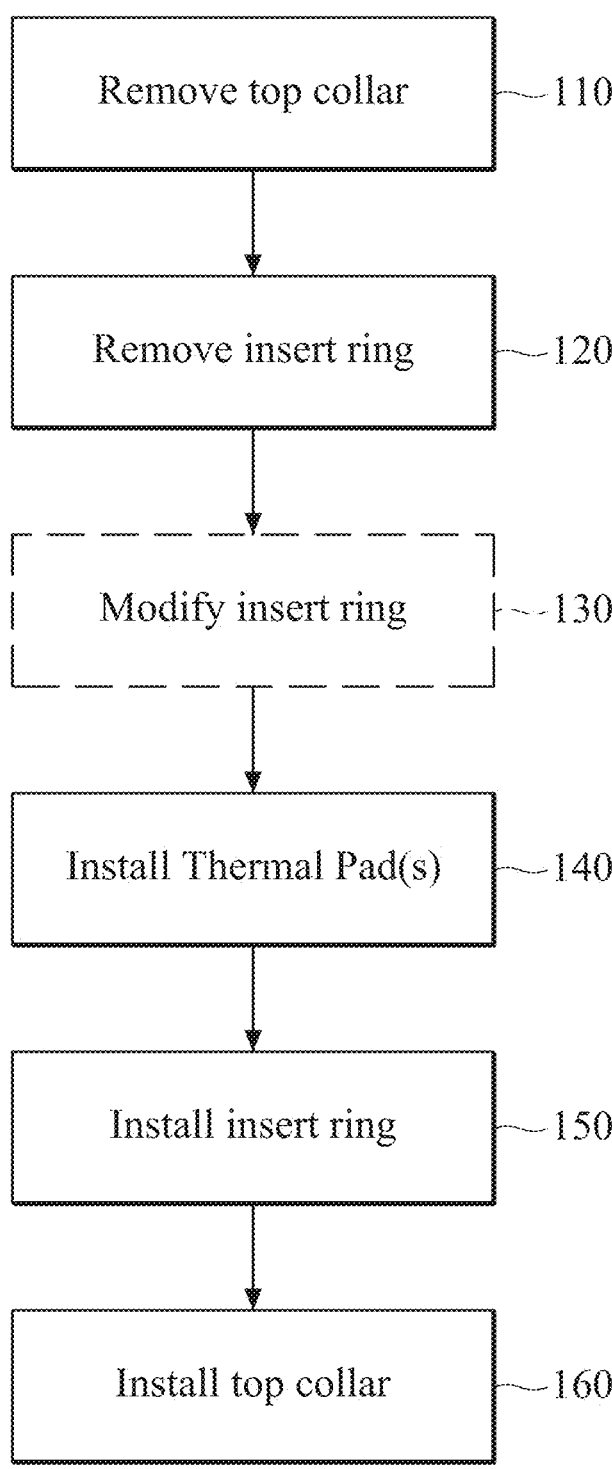
FIG. 8 is a flow diagram for providing a thermal pad, in accordance with some embodiments.

FIG. 8 is a flow diagram for providing a thermal pad in accordance with some embodiments. At step 110, the top collar ring 54 (if used) is removed. At step 120, the insert ring 48 is removed. At step 130, the insert ring 48 is optionally modified or a new insert ring 58 may be provided having a bottom step to provide for the thermal pad 60. At step 140, the thermal pad 60 or thermal pads 60 are installed. The thermal pad 60 may be installed on the electrostatic chuck 16 step or on the insert ring 58 bottom step. At step 150, the modified or new insert ring 58 is installed. At step 160, the top collar ring 54 (if used) is installed.

Figure 31:
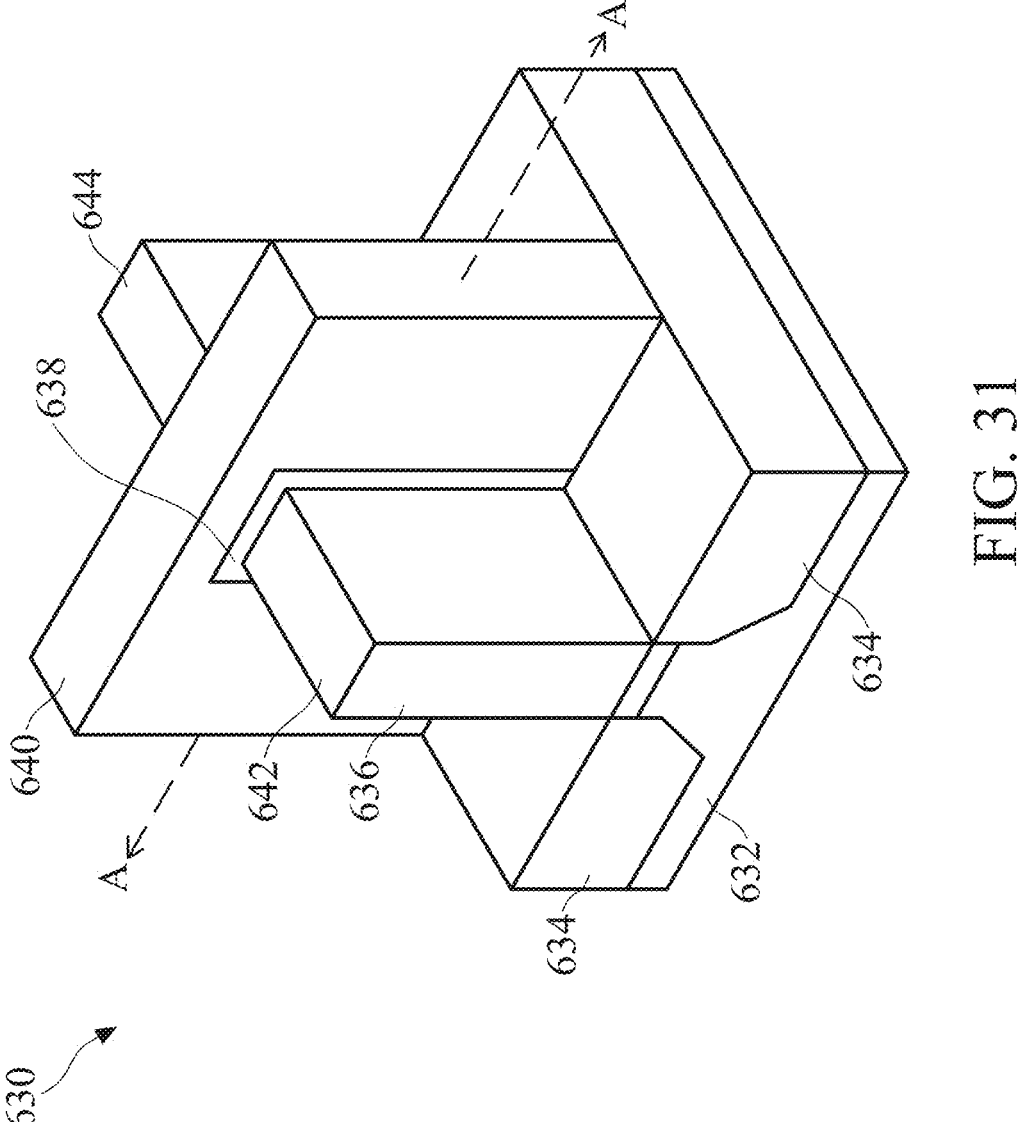
FIG. 31 illustrates an example of a fin field-effect transistor (FinFET) in a three-dimensional view, in accordance with some embodiments.

FIG. 31 illustrates an example of a fin field-effect transistor (FinFET) 630 in a three-dimensional view. The FinFET 630 comprises a fin 636 on a substrate 632. The substrate 632 includes isolation regions 634, and the fin 636 protrudes above and from between neighboring isolation regions 634. A gate dielectric 638 is along sidewalls and over a top surface of the fin 636, and a gate electrode 640 is over the gate dielectric 638. Source/drain regions 642 and 644 are disposed in opposite sides of the fin 636 with respect to the gate dielectric 638 and gate electrode 640. FIG. 31 further illustrates reference cross-sections that are used in subsequent figures. Cross-section A-A is across a channel, gate dielectric 638, and gate electrode 640 of the FinFET 630. Subsequent figures are shown along a cross-section consistent with the cross-section A-A.

FIGS. 9-19 illustrate an embodiment illustrating the use of a thermal pad in etching gate masks for gate replacement and the formation of a semiconductor device on a wafer, in accordance with some embodiments. FIGS. 9-12 and 20-26 illustrate another embodiment illustrating the use of a thermal pad in etching gate masks for gate replacement and the formation of a semiconductor device on a wafer, in accordance with some embodiments. One of ordinary skill will understand that the thermal pad may be used in etching processes other than those specifically described here. In general, the thermal pad is useful in any etch process where etch rates are susceptible to temperature variations in the material to be etched.

Figure 9:
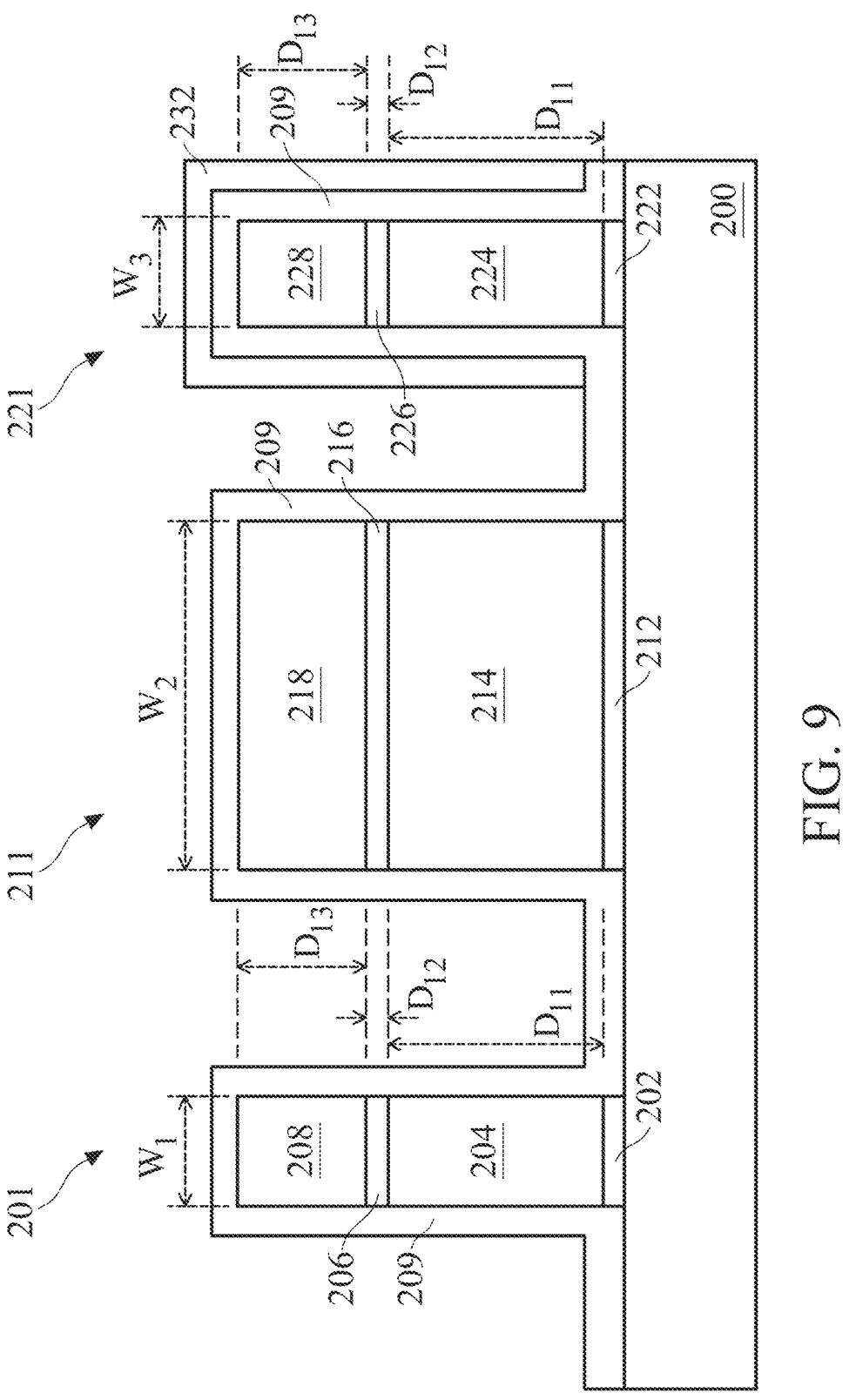
FIGS. 9-19 illustrate various intermediate steps in the formation of a semiconductor device using a thermal pad, in accordance with some embodiments.

FIG. 9 illustrates a portion of a transistor structure at an intermediate step in the formation thereof. The view of FIG. 9 is a cross-sectional view of gate structures formed over a semiconductor material 200. The semiconductor material 200 may be, for example, a portion of a fin (or semiconductor strip) from a FinFET structure. The semiconductor material 200 may be part of or attached to a wafer (such as wafer 52, described above with respect to FIG. 2). For ease of discussion, the semiconductor material 200 may also be referred to as wafer 200 at times, which should be understood to be a wafer such as described above with respect to wafer 52 of FIGS. 1-7*d*. The structure includes dummy gate stacks 201, 211, and 221. Dummy gate stack 201 includes a dummy gate dielectric 202, a dummy gate electrode 204, a first hard mask 206, and a second hard mask 208. Dummy gate stack 211 includes a dummy gate dielectric 212, a dummy gate electrode 214, a first hard mask 216, and a second hard mask 218. Dummy gate stack 221 includes a dummy gate dielectric 222, a dummy gate electrode 224, a first hard mask 226, and a second hard mask 228. A first gate spacer layer 209 is formed over the dummy gate stacks 201/211. A second gate spacer 232 is formed over the dummy gate stack 221.

The layers of the dummy gate stacks 201/211/221 may be formed by a progressive deposition of the dummy gate materials and then patterned to form the dummy gates stacks 201/211/221. The dummy gate dielectrics 202/212/222 may be formed from a dummy gate dielectric layer deposited over the semiconductor material 200. The dummy gate dielectric layer may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. A dummy gate layer is formed over the dummy dielectric layer, a first hard mask layer formed over the dummy gate layer, and a second hard mask layer formed over the first hard mask layer. In some embodiments, the dummy gate layer may be deposited over the dummy dielectric layer and then planarized using, for example, a CMP process. The dummy gate layer may be between about 80 nm and 120 nm thick (for example, the thickness $D_{11}$ may be about 95 nm) and may be made of, for example, polysilicon, although other materials may also be used.

The first hard mask layer may be deposited over the dummy gate layer. The second hard mask layer may be deposited over the first hard mask layer. The first hard mask layer and the second hard mask layer may include one or more layers of, for example, silicon nitride, silicon oxynitride, silicon carbide, silicon carbonitride, the like, or a combination thereof, and may be deposited (using, for example, CVD, PVD, a combination thereof, or the like) or thermally grown (for example, using thermal oxidation, or the like) according to acceptable techniques. In an embodiment, the first hard mask layer comprises a layer formed of silicon nitride and the second mask layer comprises a layer formed of silicon oxide. In some embodiments, the first mask layer may have a thickness between about 7 nm and about 13 nm (for example, the thickness $D_{12}$ may be about 10 nm), and the second mask layer may have a thickness between about 45 nm and about 130 nm (for example, the thickness $D_{13}$ may be about 50 nm).

The second hard mask layer may be patterned using acceptable photolithography and etching techniques to form the second hard masks 208/218/228. The pattern of the second hard masks 208/218/228 may then be transferred to the first hard mask layer, and dummy gate layer by an acceptable etching technique to form dummy gates 201/211/ 221. Optionally, the pattern of the second hard masks 208/218/228 may similarly be transferred to dummy dielectric layer (as shown in FIG. 9). The pattern of the dummy gates 201/211/221 covers a respective channel region of the semiconductor material 200 while exposing source/drain regions (e.g., where the materials of the source/drain epitaxial regions 240 are grown) of the semiconductor material 200. Where the semiconductor material 200 is part of a fin, the dummy gates 201/211/221 may also have a lengthwise direction substantially perpendicular to the lengthwise direction of respective fins.

A size of dummy gate stacks 201/211/221, and a pitch between the dummy gates stacks 201/211/221, may depend on a region of a die in which the dummy gates stacks 201/211/221 are formed. In some embodiments, dummy gates 201/211/221 may have a larger size and a larger pitch when located in an input/output region of a die (e.g., where input/output circuitry is disposed) than when located in a logic region of a die (e.g., where logic circuitry is disposed). In some embodiments, dummy gates, such as the dummy gates 201/211/221, may have a width between about 15 nm and about 100 nm. In some embodiments, dummy gates, such as the dummy gates 201/211/221, may have a width between about 100 nm and about 300 nm. For example, in FIG. 9, the dummy gate stack 201 may be in a logic region and have a width $W_1$ between about 15 nm and 30 nm, for example 20 nm; the dummy gate stack 211 may be in an input/output region of the die and have a width $W_2$ between about 80 nm and 200 nm, for example 120 nm; and the dummy gate stack 221 may be in a non-active region of the die (e.g., provided for testing) and have a width $W_3$ between about 15 nm and about 30 nm, for example 20 nm.

A first gate spacer layer 209 is formed on exposed surfaces of the dummy gates 201/211/221. Any suitable methods of forming the first gate spacer layer 209 may be used. In some embodiments, a deposition (such as CVD, ALD, or the like) or thermal oxidation may be used form the first gate spacer layer 209. In some embodiments, the first gate spacer layer 209 may include one or more layers of, for example, silicon nitride (SiN), silicon oxynitride, silicon carbonitride, silicon oxycarbonitride (SiOCN), a combination thereof, or the like. In some embodiments, a second gate spacer 232 may be formed over the first gate spacer layer 209 using similar processes and materials as the first gate spacer layer 209. In some embodiments, prior to forming the second gate spacer 232, some gates may be masked to prevent formation of the second spacer layer thereon. For example, in FIG. 9, a second spacer layer is formed only over the dummy gate stack 221. In an embodiment, the first gate spacer layer 209 comprises one or more layers of SiOCN and the second gate spacer layer comprises SiN. In some embodiments, the first gate spacer layer has a thickness between about 3 nm and about 15 nm, such as about 8 nm, and the second gate spacer layer has a thickness between about 3 nm and about 15 nm, such as about 8 nm.

Figure 10:
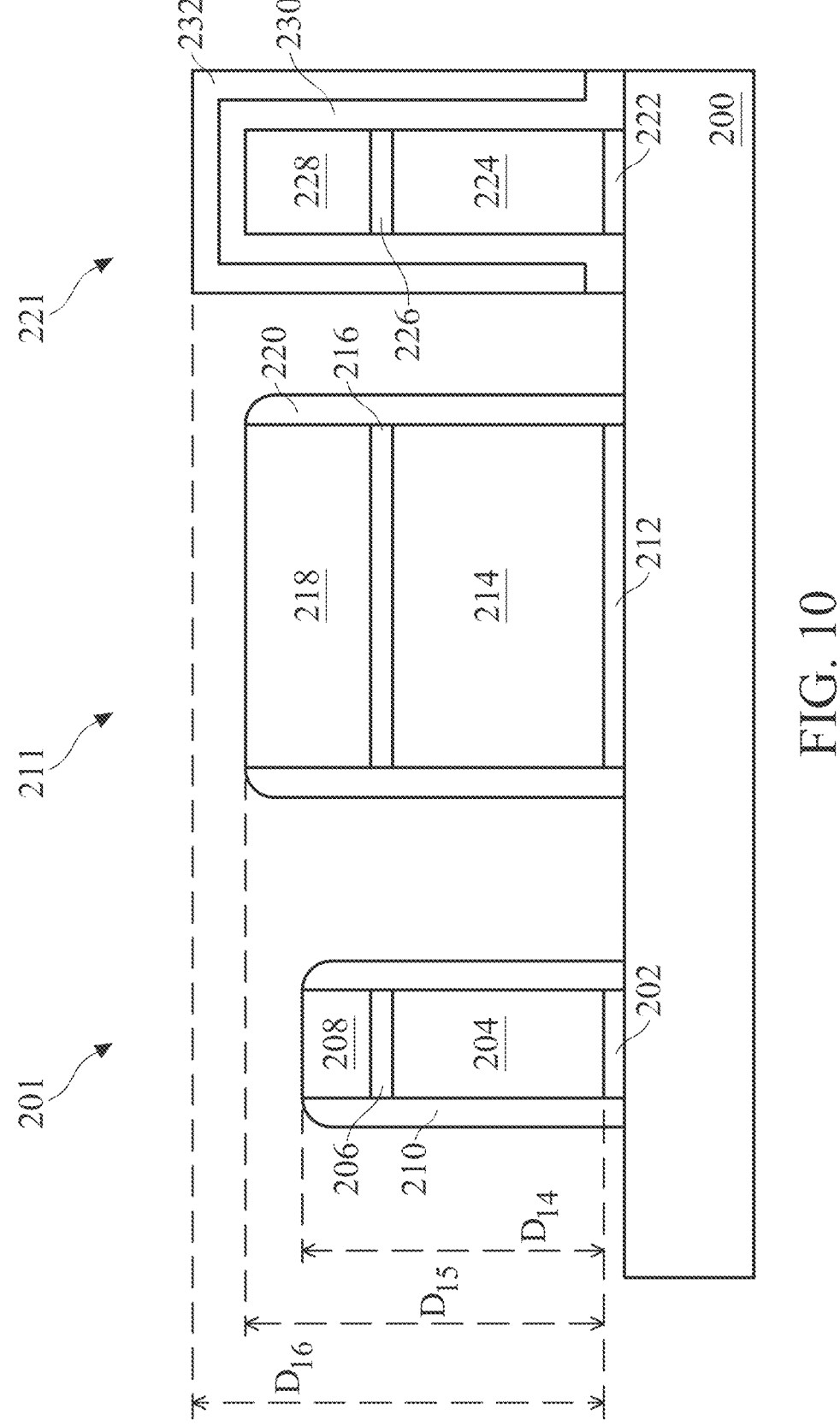

In FIG. 10, the first gate spacer layer 209 is anisotropically etched to form first gate spacers 210/220/230 along sidewalls of the dummy gate stacks 201/211/221. In the etching process, lateral portions of the first gate spacer layer 209 may be removed to expose top surfaces of the semiconductor material 200 and the second hard masks 208/218 for the dummy gate stacks 201/211.

During the process to remove lateral portions of the first gate spacer layer 209, due to gate loading variations and etching rate differences associated with process variations, the resulting dummy gate stack 201 may be etched more than the dummy gate stacks 211/221. For example, the dummy gate stack 211 is wider than the dummy gate stack 201. Thus, removing the excess portions of the first gate spacer layer 209 from atop the second hard mask 218 will take longer than removing the excess portions of the first gate spacer layer 209 from atop the second hard mask 208 of the first dummy gate stack 201. As a result, when the first gate spacer layer 209 is anisotropically etched, the portion of the first gate spacer layer 209 over the second hard mask 208 will be removed and the second hard mask 208 may begin to etch while the first gate spacer layer 209 is still being etched from over the second dummy gate stack 211. In the example illustrated in FIG. 10, about 5 nm of the second hard mask 208 of the first dummy gate stack 201 are inadvertently removed in the process of removing the excess portions of the first gate spacer layer 209.

The third dummy gate stack 221 has a similar width as the first dummy gate stack 201. However, the third dummy gate stack 221 has the second gate spacer 232 deposited thereon, which may act to prevent the selective etching of the lateral portions of first gate spacer layer 209 over the third dummy gate stack 221.

Thus, the gate height of the first dummy gate stack 201 (including the hard masks 206/208, not including the dummy gate dielectric 202) is the height $D_{14}$, which in some embodiments may be between about 100 nm and 180 nm, for example, about 140 nm. The gate height of the second dummy gate stack 211 (including the hard masks 216/218, not including the dummy gate dielectric 212) is the height $D_{15}$, which in some embodiments may be between about 135 nm and 215 nm, for example, about 175 nm. The gate height of the third dummy gate stack 221 (including the hard masks 226/228 and first gate spacer 230 and second gate spacer 232, not including the dummy gate dielectric 222) is the height $D_{16}$, which in some embodiments may be between about 150 nm and 250 nm, for example, about 200 nm. However, these dimensions are merely examples and any suitable dimensions may be utilized.

Figure 11:
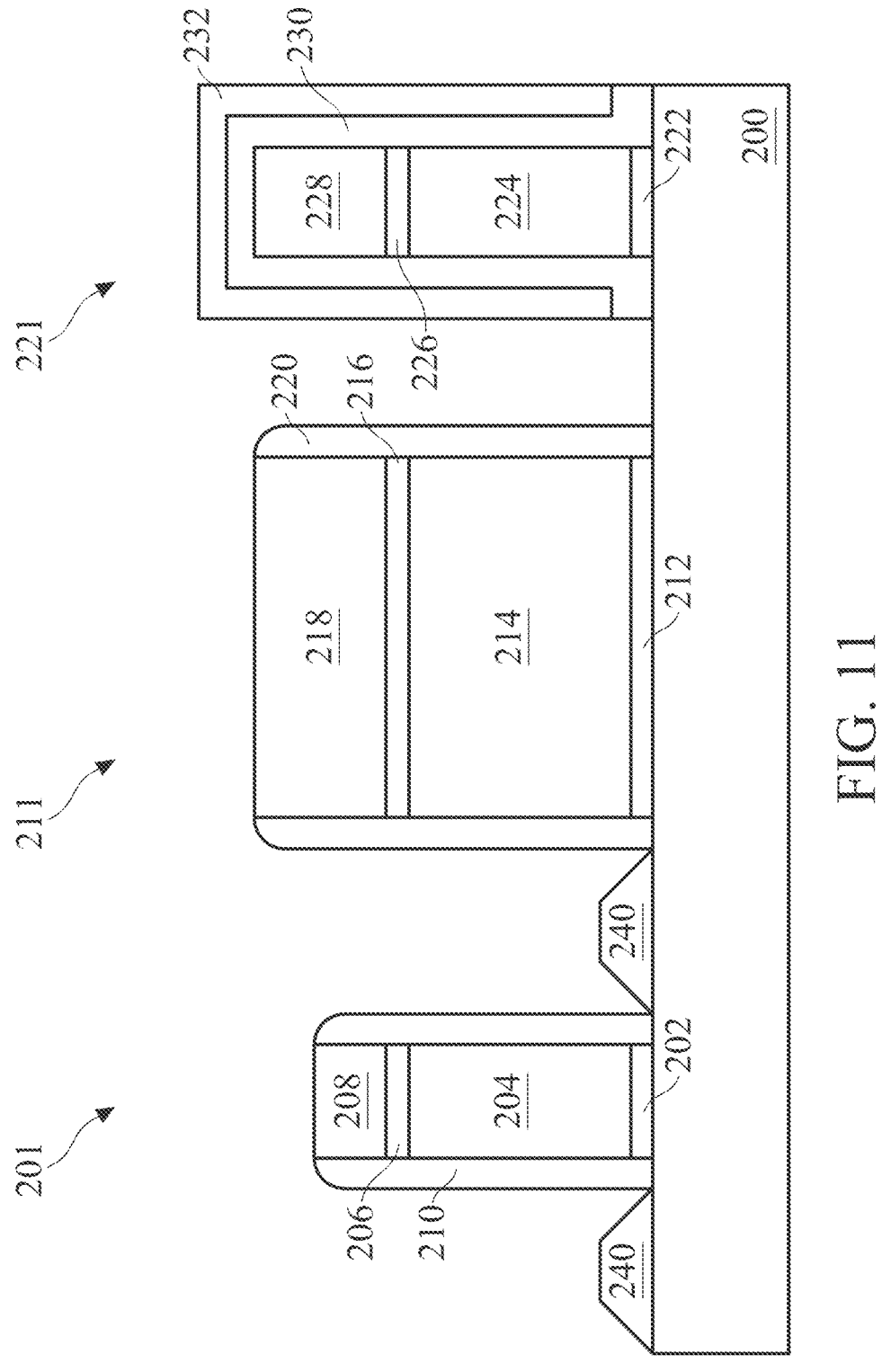

Referring to FIG. 11, epitaxial source/drain regions 240 may be formed adjacent the dummy gates, e.g., dummy gate stack 201 as illustrated, using any acceptable process. Epitaxial source/drain regions 240 may also be referred to as epitaxial source/drain structures 240. In some embodiments, recesses (not shown) may be etched in the semiconductor material 200 in source/drain regions and epitaxial structures formed in the recesses to form the epitaxial source/drain structures 240. In some embodiments, the epitaxial source/drain structures 240 are epitaxially grown in the recesses using metal-organic CVD (MOCVD), molecular beam epitaxy (MBE), liquid phase epitaxy (LPE), vapor phase epitaxy (VPE), selective epitaxial growth (SEG), a combination thereof, or the like. The epitaxial source/drain structures 240 may include any acceptable material, such as any material that is appropriate for n-type FETs, such as FinFETs. For example, if the semiconductor material 200 is silicon, the epitaxial source/drain structures 240 may include silicon, SiC, SiCP, SiP, or the like. The epitaxial source/drain structures 240 may have surfaces raised from respective surfaces of the semiconductor material 200 and may have facets. In some embodiments, the epitaxial source/drain structures 240 are formed in the semiconductor material 200 such that each dummy gate stacks 201/211/221 may be disposed between respective neighboring pairs of the epitaxial source/drain structures 240. In some embodiments, the epitaxial source/drain structures 240 are not formed in non-active regions of the die, such as where dummy gate stack 231 is disposed. Epitaxial source/drain structures 240 may or may not be formed on adjacent sides of the dummy gate stack 221 in an input/output region of the die.

The epitaxial source/drain structures 240 may be doped in situ during formation or doped after formation with an appropriate n-type or p-type dopant.

FIGS. 12-16 illustrate a gate replacement process in accordance with some embodiments. FIGS. 20-26, discussed further below, illustrate a gate replacement process in accordance with other embodiments. Due to the thermal pad usage during hard mask etching of the dummy gate stacks, a more uniform gate height can be achieved.

Figure 12:
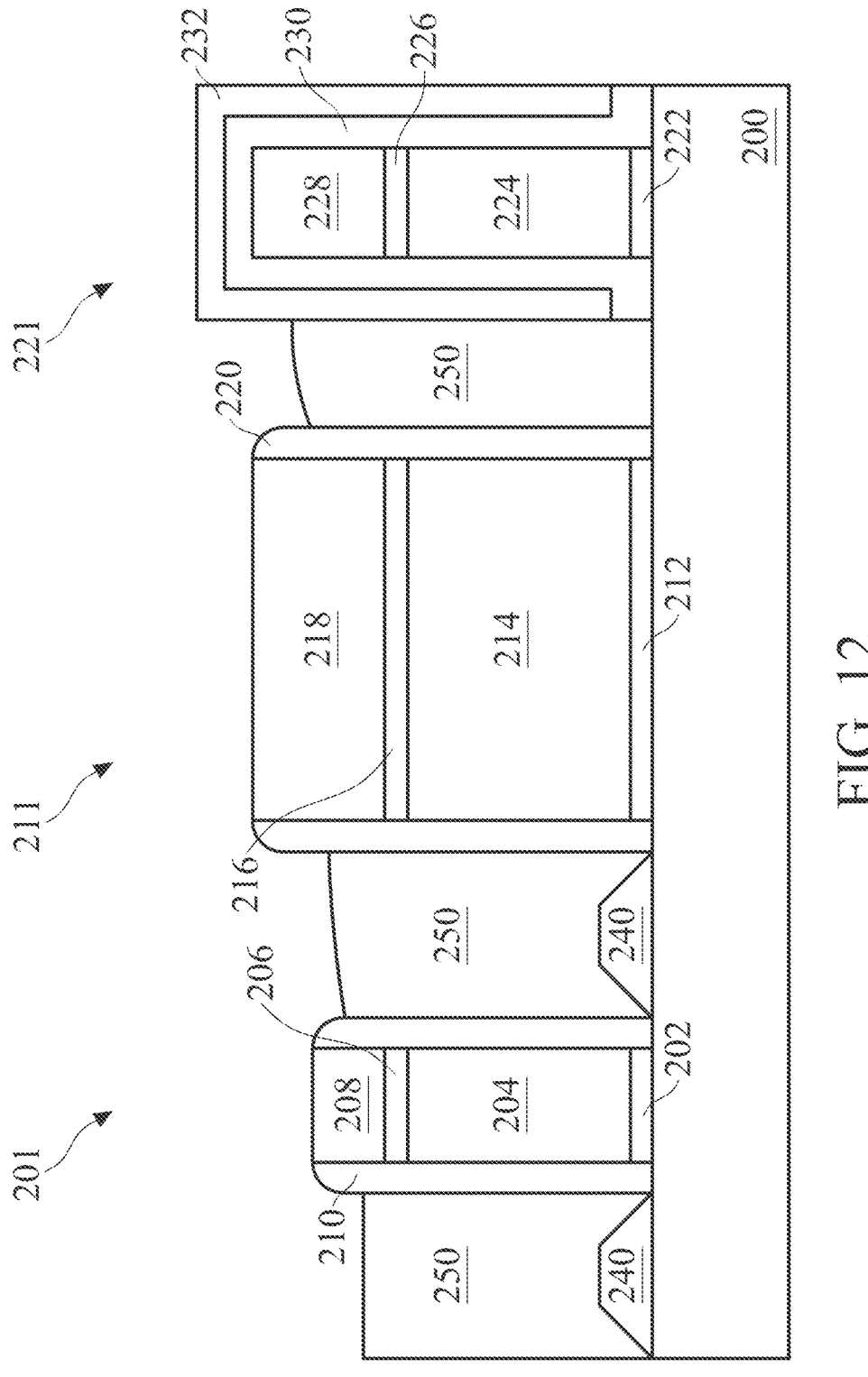

FIG. 12 illustrates a photoresist 250 deposited between the dummy gate structures to protect the source/drain epitaxial structures 240 and semiconductor material 200. Photoresist 250 may be deposited using any suitable method. In some embodiments, where the photoresist 250 covers the dummy gates 201/211/221, the photoresist 250 can be patterned to expose a top portion of each of the dummy gates 201/211/221. The remaining photoresist 250 between gate structures 201/211/221 will have a height and top surface contour that depends on the differences in gate heights and gate spacing between adjacent gates.

Figures 13, 14:
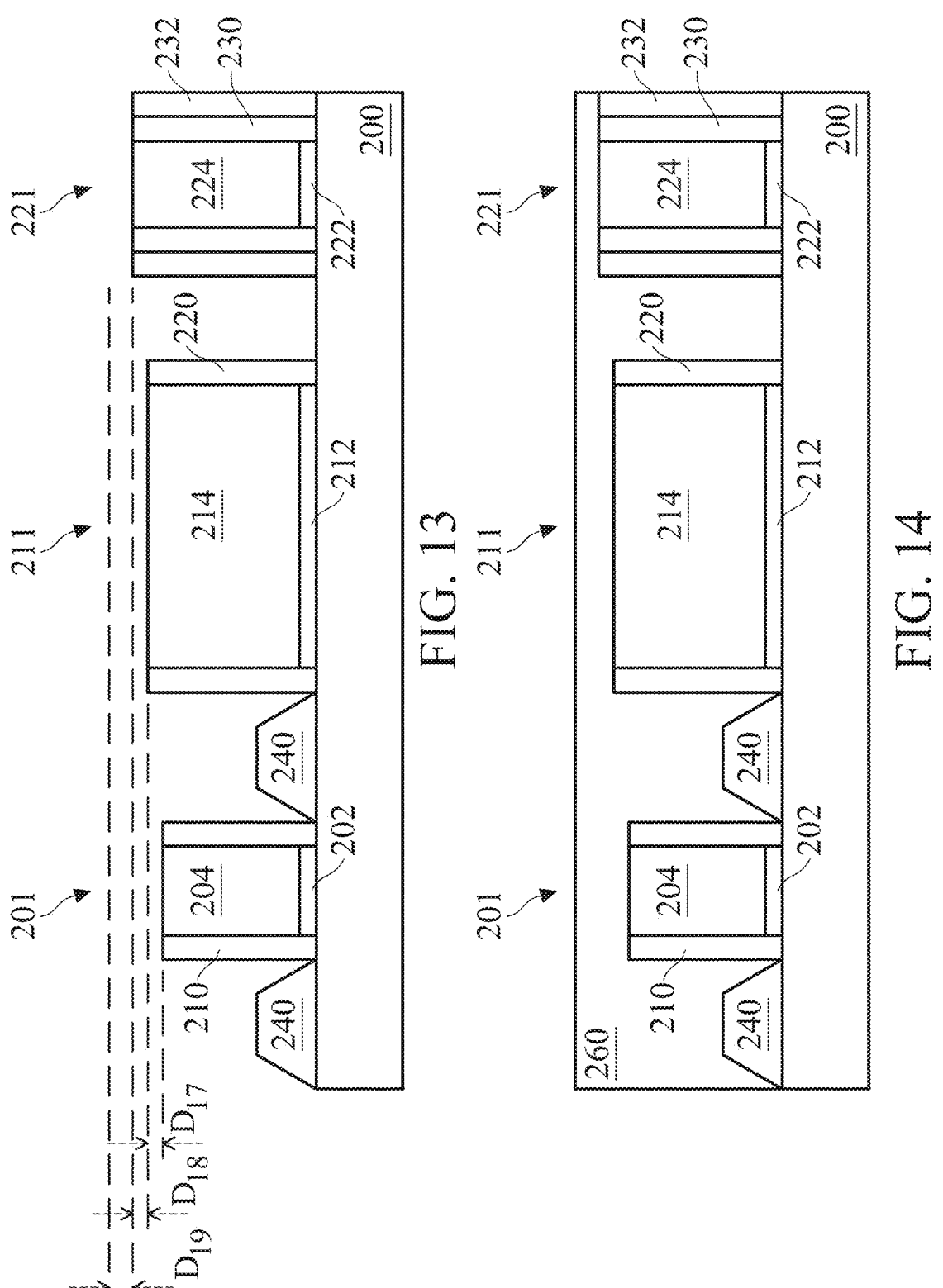

FIG. 13 illustrates the removal of the second hard masks 208/218/228 and the removal of the first hard masks 206/216/226 (see, e.g., FIG. 12). The structure can be placed in an etching chamber, such as the etching chamber 10, described above with respect to FIGS. 1 through 7D, the etching chamber having a thermal pad, such as the thermal pad 60 interposed between an insert ring and the electrostatic chuck. The thermal pad is configured to dissipate heat from an edge of the wafer 200 to achieve a more uniform etch over the gate loading.

As discussed above, the semiconductor material 200 may correspond to the wafer 52 of FIGS. 1 through 7D. In accordance with some embodiments, the etching described above to etch the first hard masks 206/216/226 and second hard masks 208/218/228 may be performed in multiple stages. The etchant gas used may include $CH_3F$. The etchant gas may also include $C_4F_6$, $CF_4$, CO, $CHF_3$, $C_4F_8$, $CH_2F_2$, and/or $SF_6$. Oxygen ($O_2$) may be added into the process gas to slow the etch rate.

Due to the gate loading effects (for example, dummy gate stack 211 being wider than dummy gate stack 201 or dummy gate stack 201 being shorter than dummy gate stack 221), there may be different etch rates across the wafer 200. In addition, because the etching may be performed in multiple stages, a chamber idle time may affect the etch rates. For example, a first stage etch may include etching lateral portions of the second gate spacer 232 over dummy gate stack 221 (and like gates). A second stage etch may include etching the remaining lateral portions of the first gate spacer 230 over dummy gate stack 221 (and like gate stacks) which were previously covered by the second gate spacer 232. A third stage etch may include etching the second hard masks 208/218/228 from each of the dummy gate stacks 201/211/221, respectively. A fourth stage etch may include etching the first hard masks 206/216/226 from each of the dummy gate stacks 201/211/221, respectively.

Each of the etching stages may target a particular material for etching, such as various hard masks, however, other non-targeted materials may also be consumed in part or in whole by the etching stages. For example, the photoresist 250 may be consumed by the etching stages. In another example, the first stage etching targeting the second gate spacer 232 may incidentally etch portions of the second hard masks 208 and 218 of the dummy gate stacks 201/211, respectively. Similarly, etching the first gate spacer 230 may incidentally etch portions of the second hard masks 208 and 218 and/or portions of the first hard masks 206 and 216.

In some embodiments, a multistage etch may have a chamber idle time between each stage. Chamber idle time, for example, may be used to clean and maintain the chamber, exchange process gasses, or to allow the chamber to cool between etch stages. As chamber idle time increases, the etch rates upon resumption of etching may increase due to the falling temperature.

A thermal pad, such as the thermal pad 60, provides a continuous heat dissipation mechanism for the wafer edge and insert ring during chamber idle time. The thermal pad 60 allows for a more stable etch rate across the wafer due to better temperature uniformity. Without the thermal pad 60, during chamber idle the edge of the wafer 200 would become disproportionately hot compared to the cooling center portions of the wafer 200. Such disproportionate heat would cause a slow etch rate at those hotter temperatures at the wafer edge and may exacerbate the effect of gate loading differences on gate height. With such differences, narrower gates more susceptible to etchant may become too short and cause gate shorting. With the thermal pad 60, however, due to a more consistent etch rate across the wafer 200 after chamber idle time, the gate height differences due to gate loading effects are improved by making the etch rate more consistent.

A demonstration of the realized effects of the thermal pad 60 will be discussed below, with respect to FIGS. 27A through 30B.

Referring to FIG. 13, following the etching, any remaining photoresist 250 is removed by any acceptable process. The top surface of the dummy gate electrodes 204/214/224 have been exposed. The dummy gates 201/211/221 have each been over etched by a height $D_{19}$ of about 3-7 nm, for example 5 nm. As a result of the incidental etching due to the gate loading effects, the dummy gate electrode 204 has been incidentally etched by a height $D_{17}$ of about 3-7 nm, for example 5 nm. In the present example, where the gate height $D_{11}$ (FIG. 9) was about 95 nm, the new gate height of dummy gate electrode 204 is about 90 nm. Similarly, as a result of the incidental etching due to the gate loading effects, the dummy gate electrode 214 has been incidentally etched by a height $D_{18}$ of about 1-5 nm, for example 3 nm. In the present example, where the gate height $D_{11}$ (FIG. 9) was about 95 nm, the new gate height of dummy gate electrode 214 is about 87 nm. Due to the over etching of the dummy gate stack 221, in the present example where the gate height $D_{11}$ was about 95 nm, the new gate height of the dummy gate electrode 224 is about 90 nm.

By using a thermal pad (such as thermal pad 60) in the etching process, the gate height difference in the end device may be less than about 3.0 to about 6.5 nm.

Next, as shown in FIG. 14, an etch stop layer (not shown) and a first interlayer dielectric (ILD) 260 are formed over the dummy gates 201/211/221 and in the spaces next to the dummy gates 201/211/221, over the epitaxial source/drain regions 240. In some embodiments, the ILD 260 is a flowable film formed by a flowable CVD. In some embodiments, the ILD 260 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a combination thereof, or the like. In some embodiments, the etch stop layer is used as a stop layer while patterning the ILD 260 to form openings for subsequently formed contacts. Accordingly, a material for the etch stop layer may be chosen such that the material of the etch stop layer has a lower etch rate than the material of ILD 260.

Figures 15, 16:
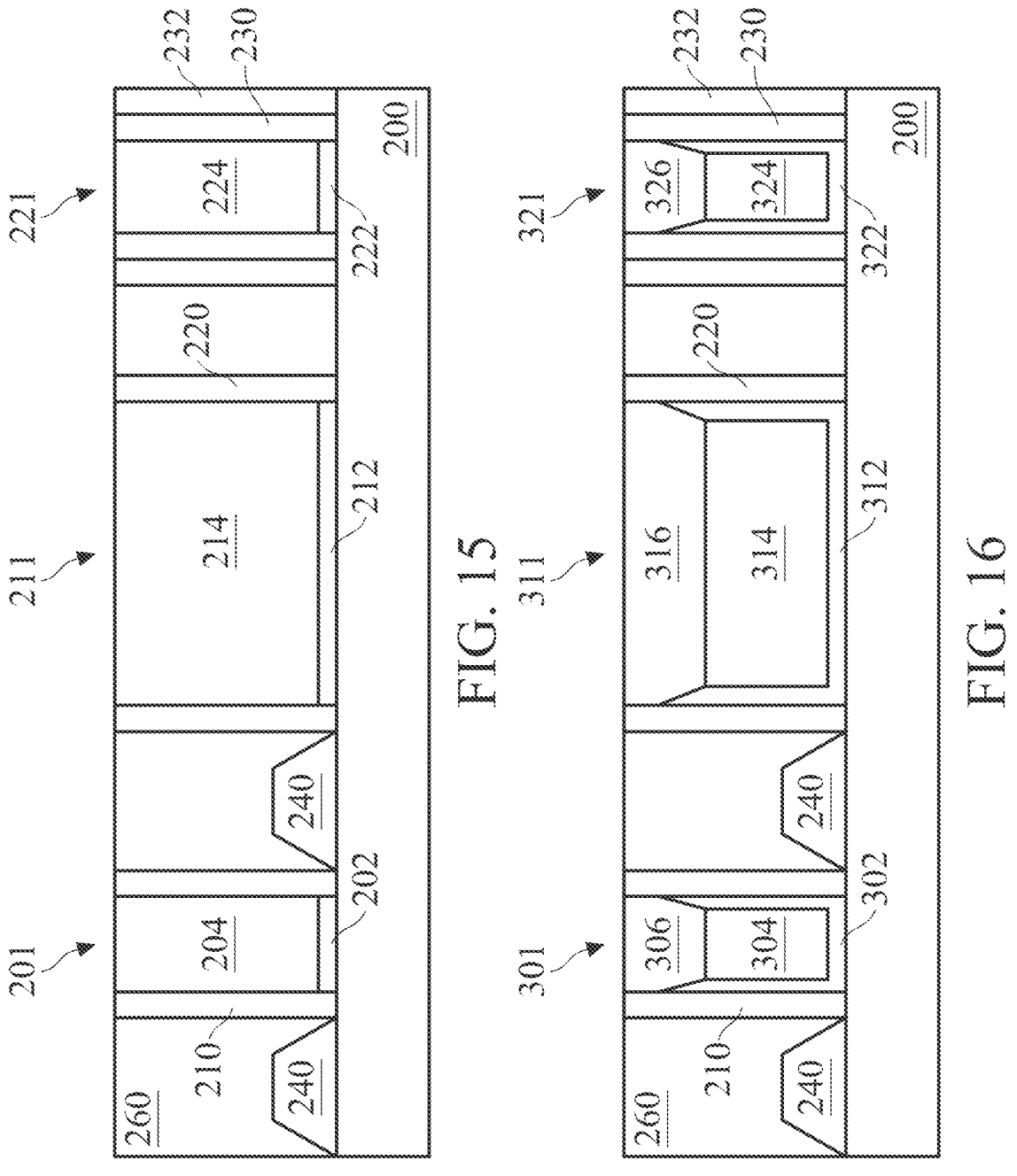

Referring to FIG. 15, a planarization process, such as a CMP, may be performed to level the top surface of ILD 260 with the top surfaces of the dummy gates 201/211/221. After the planarization process, top surfaces of the dummy gate electrodes 204/214/224 are exposed through the ILD 260. The height of each of the dummy gate electrodes 204/214/ 224 may be planarized to be about the height of the shortest dummy gate electrode. In the present example, that is dummy gate electrode 204 at about 90 nm high. Because the thermal pad 60 was used in the process of etching the first hard masks 206/216/226 and second hard masks 208/218/ 228, the overall average gate height is higher, resulting in better preservation of gate heights. In other words, the gates (including, especially the shortest gates resulting from gate loading effects) are taller than they would be without etching with the thermal pad 60.

Next, as shown in FIG. 16, the dummy gates 201/211/222 have been replaced with metal gates 301/311/321, respectively. As part of the replacement, dummy gate electrodes 204/214/224 of FIG. 15 have been replaced with metal gate electrodes 304/314/324 and the dummy gate dielectric 202/ 212/222 have been replaced with gate dielectric layers 302/312/322, respectively. Also, the metal gate electrodes 304/314/324 have been recessed and a self-align contact insulating film 306/316/326 has been formed over each of the metal gate electrodes 304/314/324.

Replacing the dummy gates 201/211/221 with the metal gates 301/311/321 may be done by any suitable process. In some embodiments, the dummy gates 201/211/221 may be removed by etching between the respective first gate spacers 210/220/230 to remove the dummy gate electrodes 205/215/ 225 and dummy gate dielectrics 202/212/222, using a suit- able etchant and etching technique. The dummy gate elec- trode and dummy gate dielectric removal forms recesses (not shown) between the first gate spacers.

In some embodiments, gate dielectric layers 302/312/322 are deposited conformally in the recesses and over the ILD 260. In some embodiments, the gate dielectric layers 302/ 312/322 comprise silicon oxide, silicon nitride, or multilay- ers thereof. In other embodiments, the gate dielectric layers 302/312/322 include a high-k dielectric material, and in these embodiments, the gate dielectric layers 302/312/322 may have a k value greater than about 7.0, and may include a metal oxide or a silicate of Hf, Al, Zr, La, Mg, Ba, Ti, Pb, and combinations thereof. The formation methods of the gate dielectric layers 302/312/322 may include Molecular- Beam Deposition (MBD), ALD, PECVD, a combination thereof, or the like. The gate dielectric layers 302/312/322 may extend over the surface of the ILD 260, which will be removed in a later process.

Next, the gate electrodes 304/314/324 are formed from material deposited over the gate dielectric layers 302/312/ 322 and fill the remaining portions of the recesses. The gate electrodes 304/314/324 may be made of a metal-containing material such as TiN, TaN, TaC, TiC, TiO, Co, Ru, Al, Ag, Au, W, Ni, Ti, Cu, combinations thereof, or multi-layers thereof. After the filling of the recess with the gate electrode material, a planarization process, such as a CMP, may be performed to remove the excess portions of the gate dielectric layers 302/312/322 and gate electrode material, which excess portions are over the top surface of ILD 260.

Although not illustrated, the gate electrodes 304/314/324 may include a series of one or more stacked layers (not shown). The stacked layers may be deposited conformally in the recesses, over sidewalls and bottoms of the gate elec- trodes 302/312/322, and over the top surface of the ILD 260. Stacked layers may be formed by a conformal deposition method such as ALD or CVD and have a substantially uniform thickness within process variations. The stacked layers may include a diffusion barrier layer and one or more work function layers over the diffusion barrier layer. The diffusion barrier layer may be formed of titanium nitride (TiN) or thallium nitride. The work function layer(s) deter- mine the work function of the gate, and may include at least one layer, or a plurality of layers formed of different materials. The specific material of the work function layer may be selected according to whether the respective FinFET is an n-type FinFET or a p-type FinFET. For example, when the FinFET is an n-type FinFET, the work function layer may include an AlTiC layer. When the FinFET is a p-type FinFET, the work function layer may include an AlTiN and/or AlTiC layer. After the deposition of the work function layer(s), a barrier layer (not shown), which may be another TiN layer, may be formed. Following the barrier layer, the gate electrode material such as described above can be deposited within the remaining recesses.

In some embodiments, the formation of the gate dielectric layers 302/312/322 may occur simultaneously such that the gate dielectric layers 302/312/322 are made of the same materials, and the formation of the gate electrodes 304/314/ 324 may occur simultaneously such that the gate electrodes 304/314/324 are made of the same materials. However, in other embodiments, the gate dielectric layers 302/312/322 may be formed by distinct processes, such that the gate dielectric layers 302/312/322 may be made of different materials, and the gate electrodes 304/314/324 may be formed by distinct processes, such that the gate electrodes 304/314/324 may be made of different materials. Various masking steps may be used to mask and expose appropriate regions when using distinct processes.

In some embodiments, the gate electrodes 304/314/324 may be recessed to form second recesses by partially etching the gate electrodes using suitable etchant and etching tech- niques. A self-aligned contact insulating film may be depos- ited in the recesses and over the ILD 260. The self-aligned contact insulating film may be made of SiN, silicon oxyni- tride, silicon carbonitride, SiOCN, a combination thereof, or the like. After forming the self-aligned contact insulating film, a planarization process, such as a CMP, may be performed to remove the excess portions of the self-aligned contact insulating film, which excess portions are over the top surface of ILD 260, thereby forming the self-aligned contact insulating films 306/316/326. In some embodiments, the self-aligned contact insulating films 306/316/326 may be further recessed and a cap layer (not shown) of the same or a different material (such as those listed above for the self-aligned contact insulating film) formed over the self- aligned contact insulating films 306/316/326. The self- aligned contact insulating films 306/316/326 may be used to protect the gates 301/311/321 during formation of self- aligned contacts.

Figure 17:
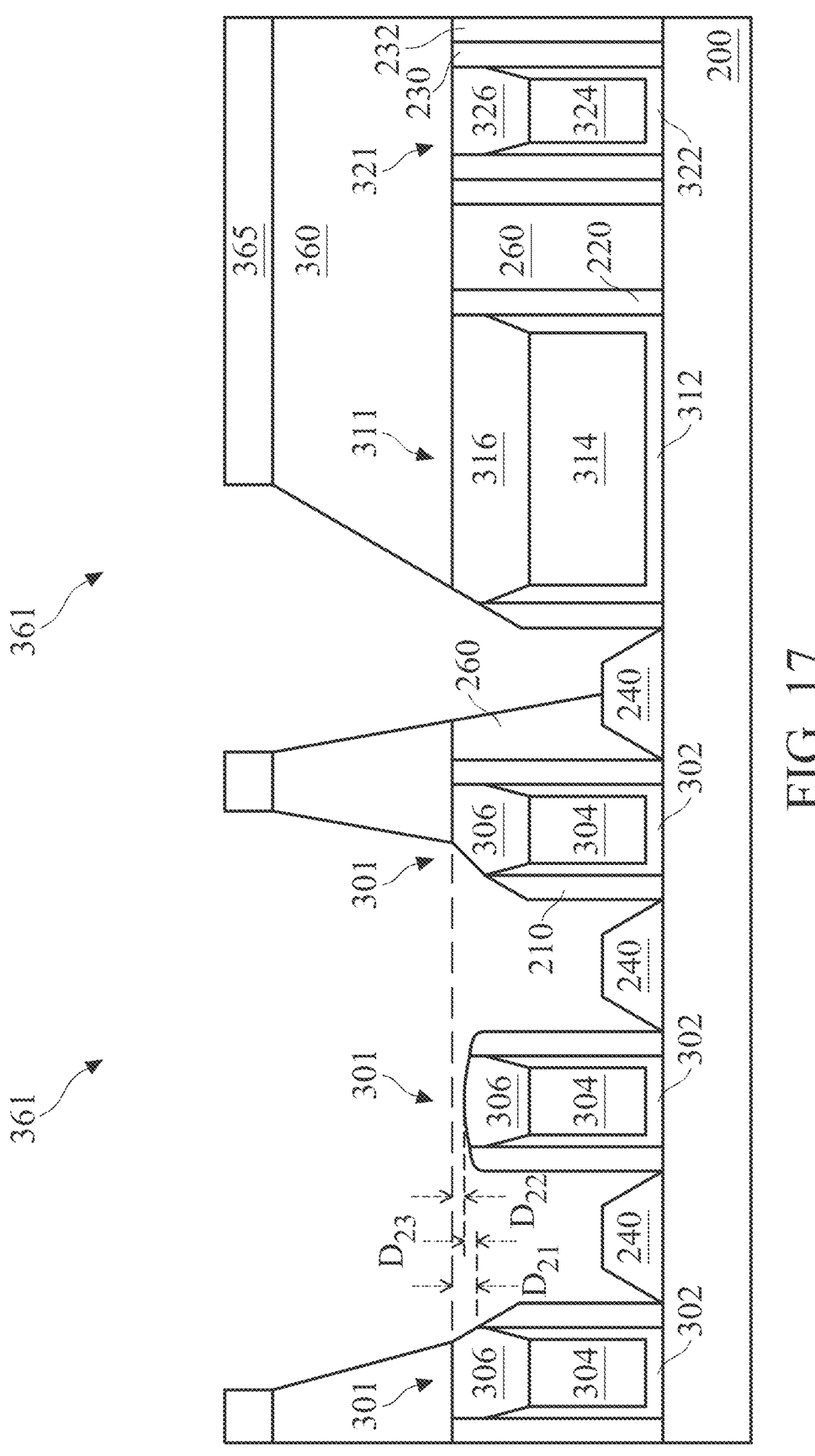
Figure 18:
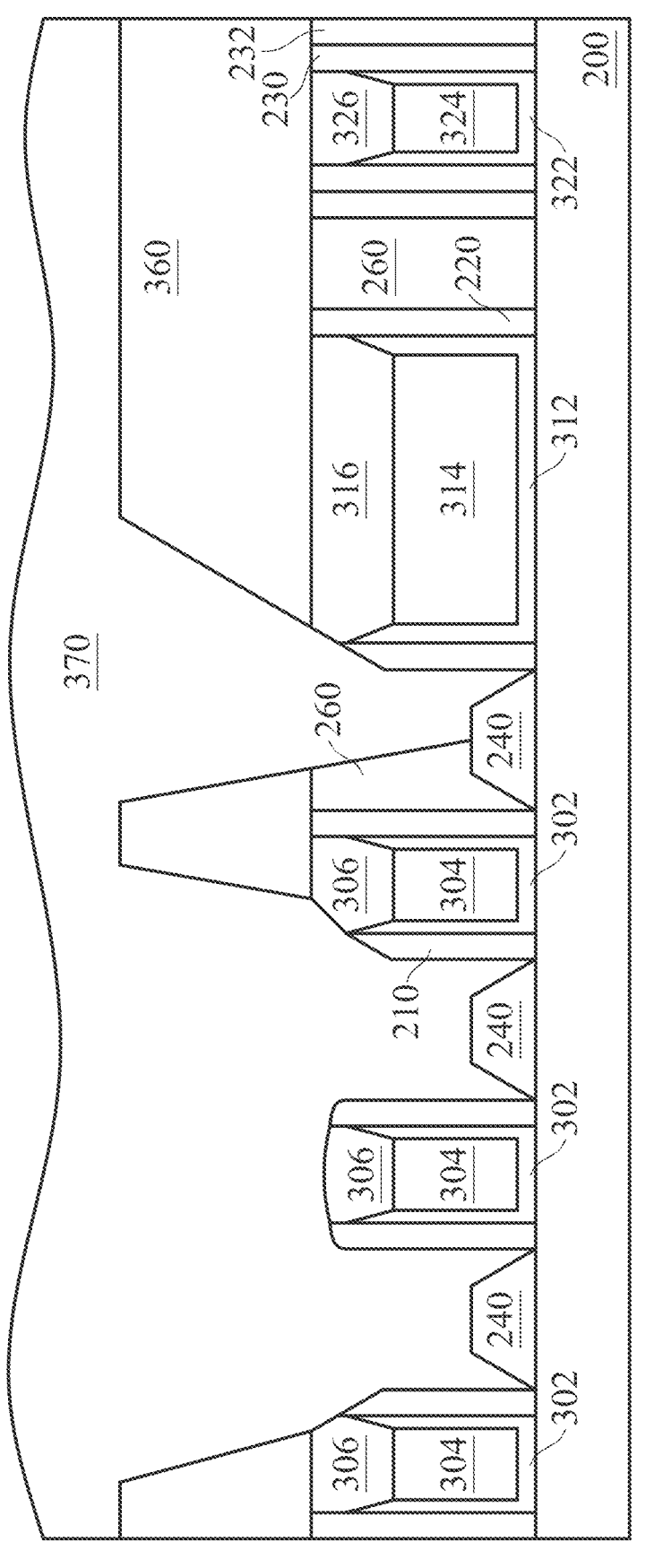
Figure 19:
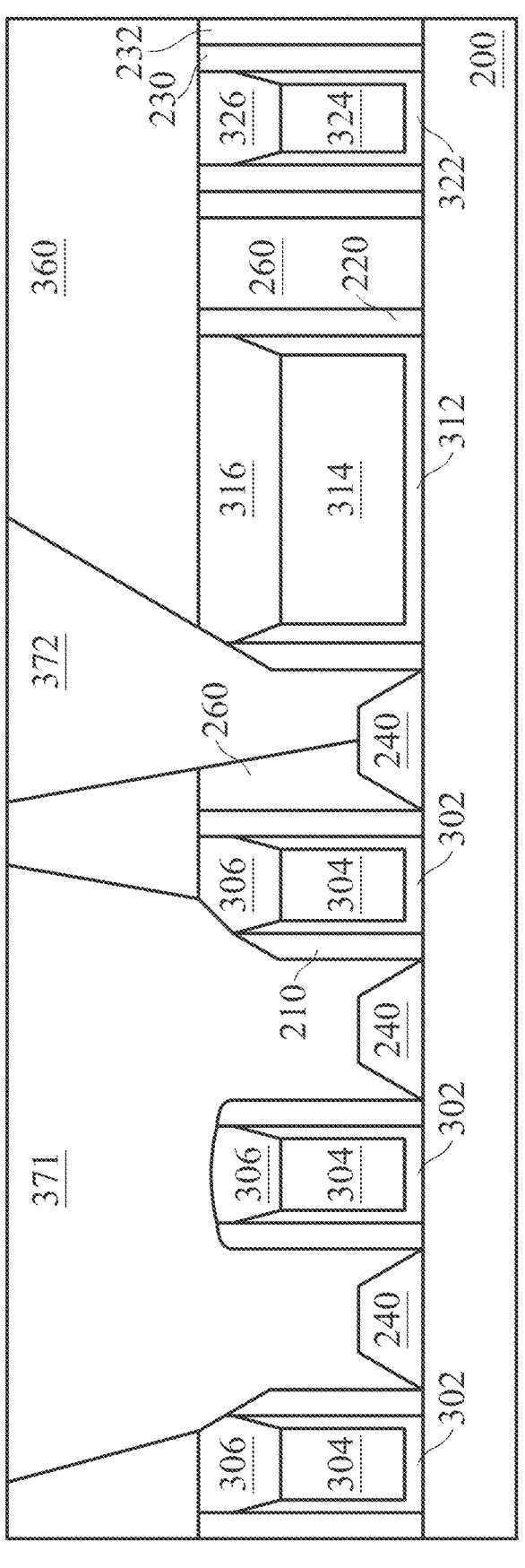

FIGS. 17-19 illustrate the formation of self-aligned con- tacts, such as self-aligned contacts 371/372 of FIG. 19, in accordance with some embodiments. The structure as illus- trated in FIG. 16 has been expanded to include two addi- tional logic-type gates 301. A second ILD 360 is deposited over the first ILD 260, using materials and processes such as discussed above with respect to the first ILD 260, which are not repeated. A hard mask 365 is formed over the second ILD 360. The hard mask 365 may be made of any suitable material, such as an oxide or nitride, such as titanium nitride. A photoresist (not shown) may be formed over the hard mask 365 and patterned to form openings in the hard mask 365 which are then transferred to the second ILD 360 and first ILD 260 using any acceptable etching technique to form the contact openings 361. The contact openings 361 may all be formed simultaneously in a same process, or in separate processes. The etch stop layer (not shown) serves as an etch stop for forming the contact openings 361. Due to the self-aligned contact insulating film 306/316/326, the contact openings 361 may be partially located over the gates (e.g., gates 301 and 311), without damaging the gates once exposed. The contact openings 361 expose the epitaxial source/drain regions 240 after the etch stop layer has been removed.

In the illustrated example of FIG. 17, the process of creating the contact openings 361 may partially etch the gates 301 and 311. The left and right gates 301 overlap the contact opening 361 and are partially etched toward the edges of the contact openings 361. The center gate 301 is partially etched over the entire contact opening 361. The gate height of the gates may be measured at an interface of the gate spacer with another different material—in the illustrated embodiment, the interface of the gate spacer 210/220/230 with the respective self-aligned contact insulating films 306/316/326. A distance $D_{21}$ from the top surface of the ILD 260 to the gate height of the left gate 301 may be about 16 nm to about 22 nm. A distance $D_{22}$ from the top surface of the ILD 260 to the gate height of the center gate 301 may be about 12 nm to about 20 nm. The distance $D_{23}$ between the gate height of the left gate and the center gate may be about 3 nm to about 6 nm. However, it should be appreciated that these dimensions are merely examples, and any suitable dimensions may be utilized. In some embodiments, by using a thermal pad (such as thermal pad 60) in the etching process, the gate height difference in the end device may be less than about 3.0 to about 6.5 nm.

The contact opening 361 over the gate 311 illustrates a self-aligned contact opening that overlaps one gate (the gate 311) but not the adjacent gate (the right gate 301).

As shown in FIG. 18, a conductive material 370 is formed in the contact openings 361. The hard mask 365 may be removed by any suitable technique. A liner (not shown), such as a diffusion barrier layer, an adhesion layer, or the like, and the conductive material 370 are formed in the openings 361. The liner may include titanium, titanium nitride, tantalum, tantalum nitride, or the like. The conductive material 370 may be copper, a copper alloy, silver, gold, tungsten, aluminum, nickel, or the like.

In FIG. 19, a planarization process, such as a CMP, may be performed to remove excess materials from a top surface of the ILD 360. The remaining liner and conductive material 370 form contacts 371 and 372 in the openings. In some embodiments, a silicide may be formed on the epitaxial source/drain regions 240 in an earlier process at the interface between the epitaxial source/drain regions 240 and the contacts 371/372. The contacts 371/372 are physically and electrically coupled to respective structures of the epitaxial source/drain regions 240. Other contacts (not shown) may also be made using a similar process and materials to physically and electrically couple to the gate electrodes.

FIGS. 20-26 illustrate a gate replacement process in accordance with some embodiments. Due to the thermal pad usage during hard mask etching of the dummy gate stacks, a more uniform gate height can be achieved.

Figure 20:
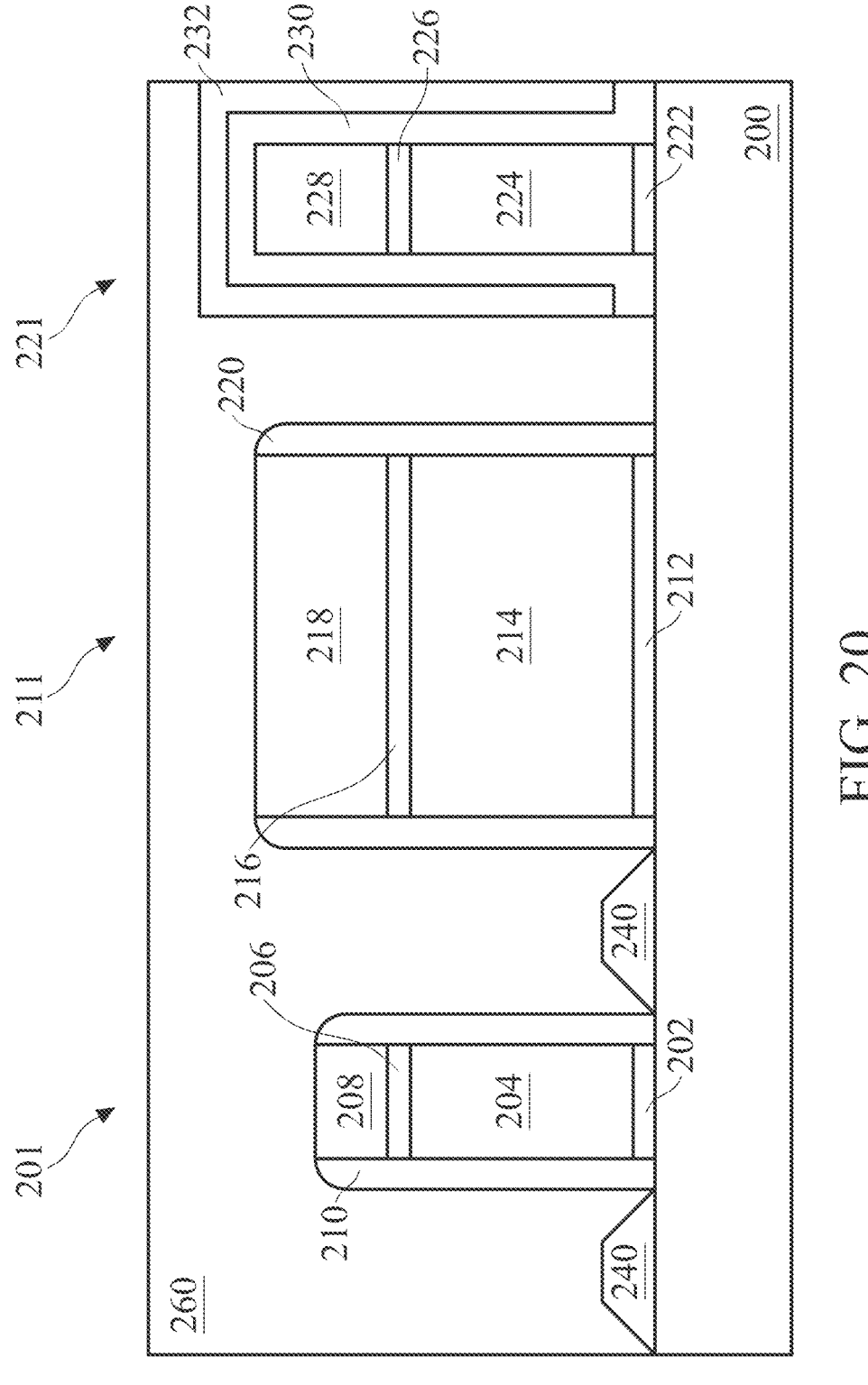

FIG. 20 continues the process assuming the steps up through FIG. 11 have been performed, as discussed above. In FIG. 20, an ILD 260 is formed over the structure, including the dummy gate stacks 201/211/221, the epitaxial source/drain regions 240 and semiconductor material 200. The ILD 260 can be formed using processes and materials as described above with respect to FIG. 14, which are not repeated.

In FIG. 21, the ILD 260 is planarized to remove the second gate spacer 232 over the dummy gate stack 221 and the first gate spacer 230 over the dummy gate stack 221. The ILD 260 is further planarized until the second hard mask 208/218/228 is exposed for all the dummy gates. In some embodiments, the second hard mask 208/218/228 may be completely removed for some gates. In some embodiments, the ILD 260 may be further planarized until the first hard mask 206/216/226 or the dummy gate electrode 204/214/224 is exposed for one or more gates. The planarization may be performed using processes and materials such as described above with respect to FIG. 15, which are not repeated.

FIG. 22 illustrates an etch process to remove the second hard masks 208/218/228 and first hard masks 206/216/226. Similar to the etch process described above with respect to FIG. 13, the etching may be performed in multiple stages using processes and materials as described above, which are not repeated. As a result of the gate loading, a difference in dummy gate height 204/214/224 can be seen in the resulting dummy gates of FIG. 22. However, due to the use of the thermal pad (such as the thermal pad 60) between the insert ring and electrostatic chuck, the edge temperature of the wafer is held at a more consistent temperature during chamber idle times, resulting in a more uniform etch than without the use of the thermal pad.

Figure 23:
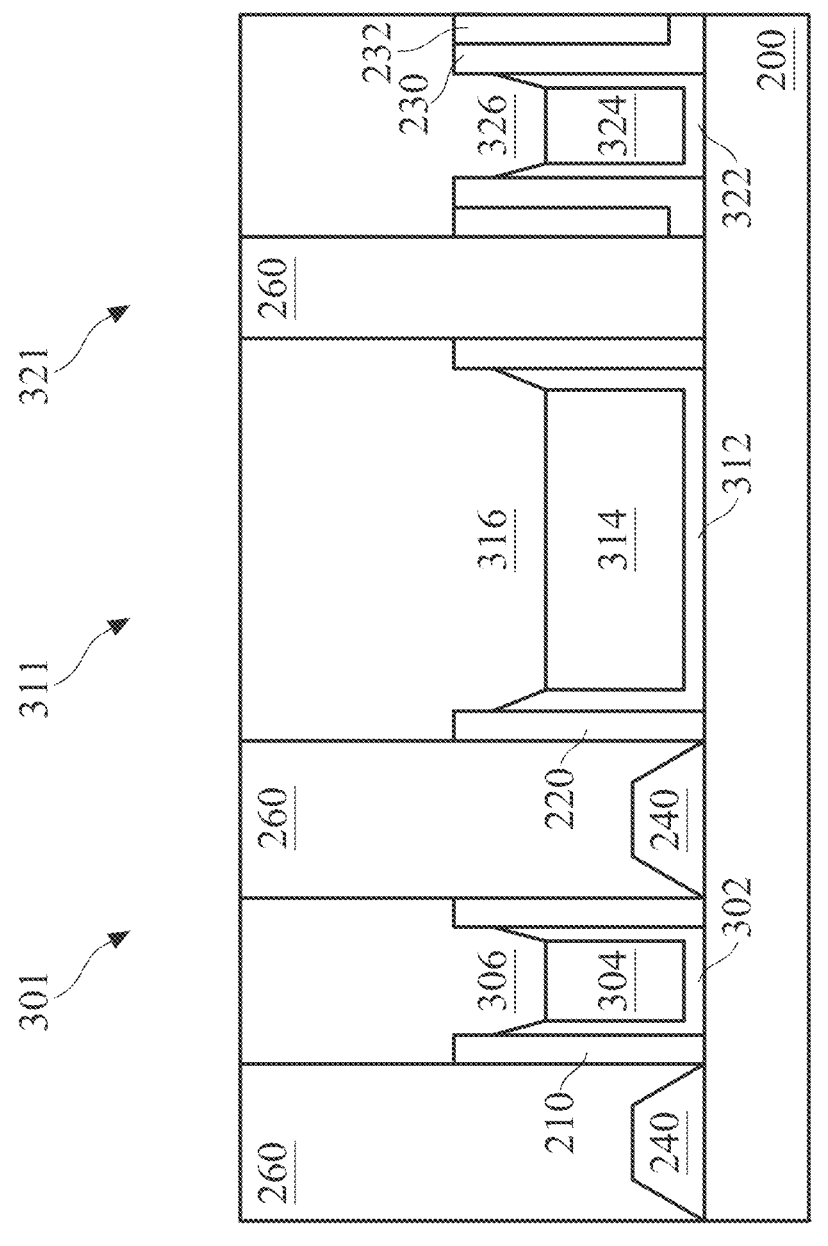

FIG. 23 illustrates the removal of the dummy gates 201/211/221 and replacement with the gates 301/311/321. The removal and replacement of the dummy gates 201/211/221 may be performed using processes and material as discussed above with respect to FIG. 16 and are not repeated. Further, the replacement gates may be recessed and a self-aligned contact insulating films 306/316/326 formed in each of the recesses between the gate spacers 210/220/230. Notably, the self-aligned contact insulating films 306/316/326 may also form above the gates in recess of the ILD 260 which formerly held the first and second hard masks (see FIG. 21).

Figure 24:
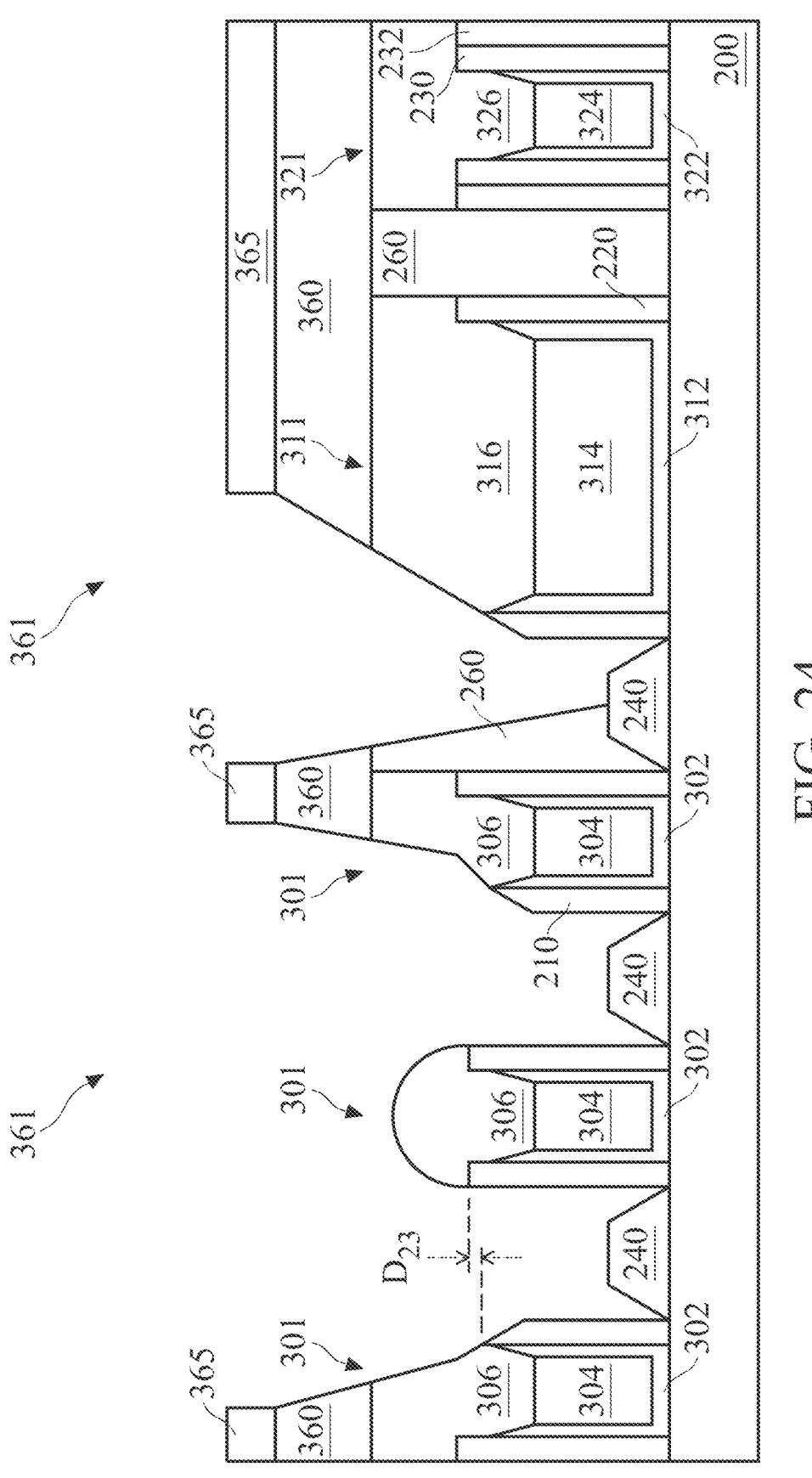

FIG. 24 illustrates the forming of contact openings 361. The contact openings 361 may be formed using processes and materials such as those discussed above with respect to the contact openings 361 of FIG. 17 and are not repeated. A distance $D_{23}$ between the left gate 301 height and the center gate 301 height may be about 3 nm to about 6 nm.

As illustrated above in FIGS. 12-19 and 20-24, the dummy gates 201/211/221 are replaced with gates 301/311/321 and contact openings 361 are formed over a multiple of the gates 301. As discussed above, gates 301 have a width (between the gate spacers) less than 100 nm. It should be understood that contact openings may also be formed over multiple gates having a width greater than 100 nm, such as the illustrated gates 311. By using the thermal pad to improve etch rate uniformity, gate loading effects can be mitigated. In both cases, the gate height differences can be less than about 3 to 6.5 nm, for example, about 6 nm.

Figure 25:
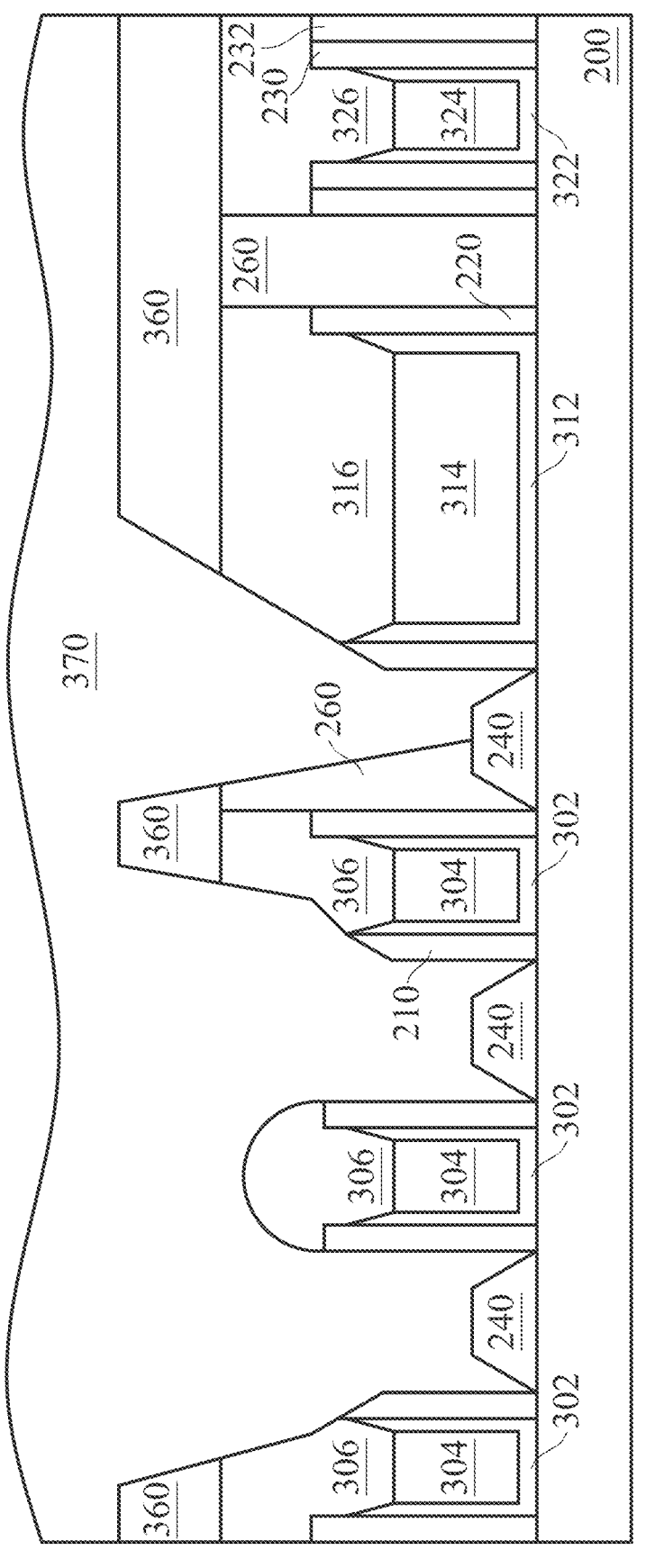
Figure 26:
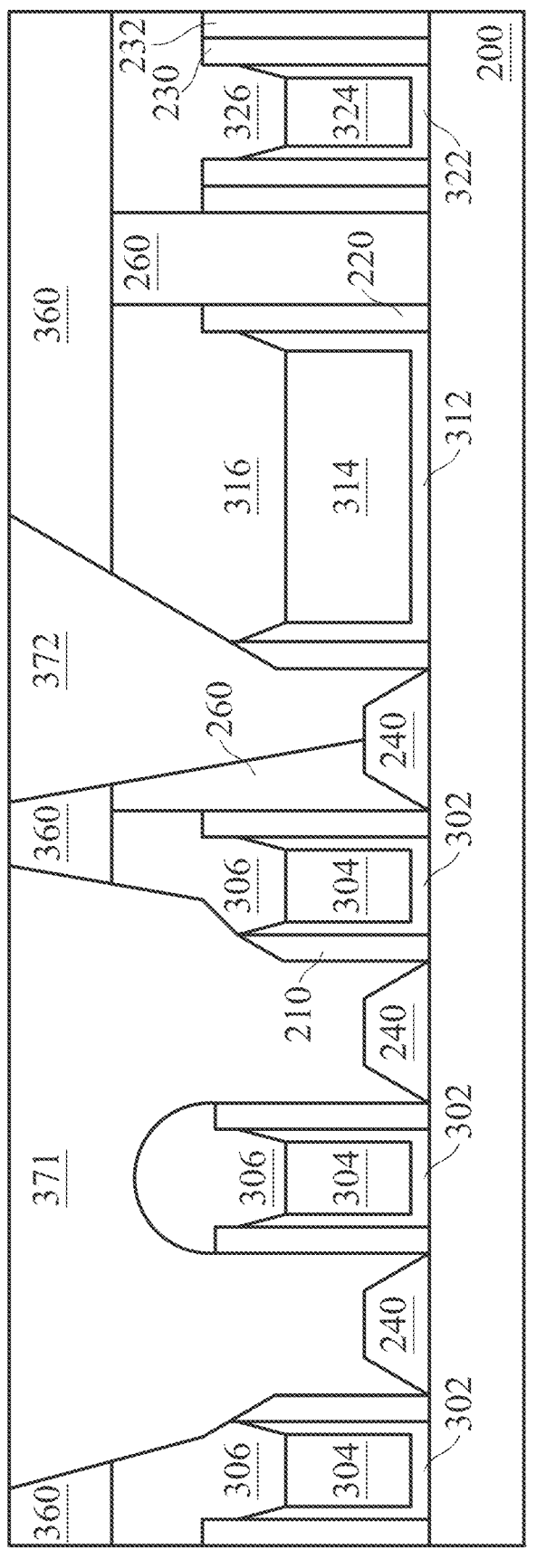

Referring to FIGS. 25 and 26, contacts 371 and 372 are formed from a conductive material 370. The contacts 371 and 372 may be formed using processes and materials such as those described above with respect to FIGS. 18 and 19 and are not repeated.

Figures 27A, 27B:
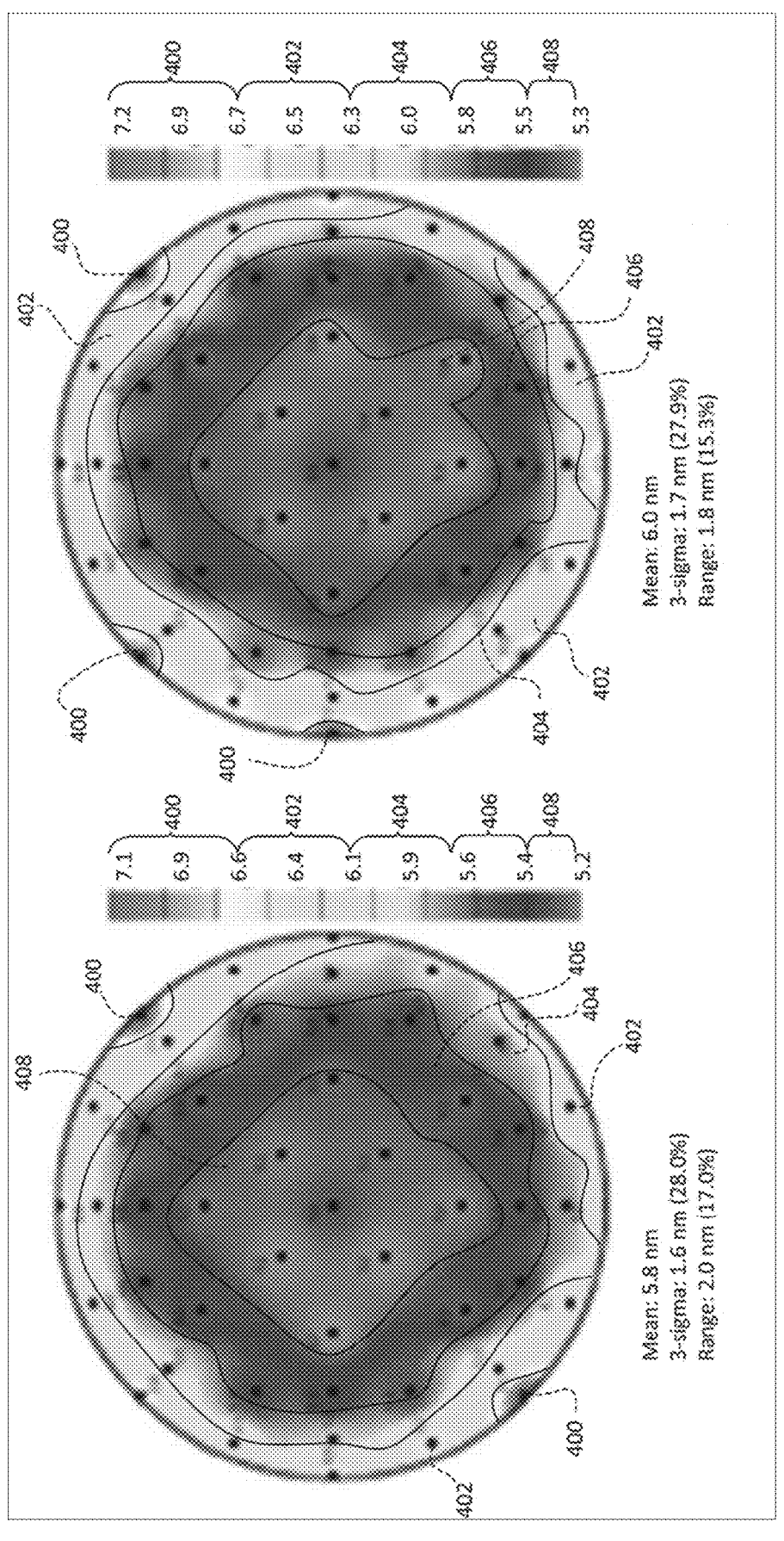
FIGS. 27A and 27B illustrate topographical maps of a wafer etch rate using a thermal pad, in accordance with other embodiments.

FIGS. 27A and 27B illustrate etch rate variance across a wafer when using the thermal pad, such as thermal pad 60, described above. FIGS. 27A and 27B are topographical maps of etch rates at different data points on the wafer. Contour lines are provided to correlate contours of etch rates that fall within defined ranges on a provided scale.

FIG. 27A illustrates the etch rate in a first test etching using the thermal pad. FIG. 27B illustrates the etch rate in a second test etching using the thermal pad. The mean etch rate in the first test was 5.8 nm/min. The etch rate within three standard deviations (3-sigma) was 5.8 nm±1.6 nm/min in the first test, representing a probabilistic etch rate variation of about 56%. The total etch rate measured range was 2.0 nm/min in the first test, representing an etch rate variation of about 17% across measured values.

As seen in FIG. 27B, the mean etch rate in the second test was 6.0 nm/min. The etch rate within three standard deviations (3-sigma) was 6.0 nm±17 nm/min in the second test, representing a probabilistic etch rate variation of about 55.8%. The total etch rate measured range was 1.8 nm/min in the second test, representing an etch rate variation of about 15.3% across measured values.

In comparison to etch rates without the thermal pad, holding all other factors the same, the etch rates without the thermal pad within three standard deviations (3-sigma) was 4.3 nm±3.7 nm/min to about 4.4 nm±3.5 nm/min, representing a probabilistic etch rate variation of about 164.8% to about 170.6%. The etch rates without the thermal pad had a measured range of 3.8 nm/min to 4.2 nm/min, representing an etch rate variation of 44-49% across measured values.

Table 1 shows a side-by-side comparison of these values.

TABLE 1

|  | With Thermal Pad | | Without Thermal Pad | |
|---|---|---|---|---|
|  | Test 1 | Test 2 | Test 1 | Test 2 |
| Mean (nm) | 5.8 | 6.0 | 4.4 | 4.3 |
| 3-sigma (nm) | 1.6 | 1.7 | 3.7 | 3.5 |
| Range (nm) | 2.0 | 1.8 | 4.2 | 3.8 |

Thus, the etch rate variation across the wafer is advantageously improved to have less variation when using the thermal pad, such as thermal pad 60.

FIGS. 28A through 30B illustrate wafer data for a gate hard mask etch process. Figures ending with "A" (FIGS. 28A, 29A, and 30A) illustrate polysilicon dummy gate electrode heights. Figures ending with a "B" illustrate hard mask layer thicknesses, where the hard masks are over the polysilicon dummy gate electrodes. FIGS. 28A through 30B provide topographical maps of gate heights or hard mask thicknesses at discreet measurement points on the wafer. Contour lines have been provided on each topographical map and correlated to a scale of gate height or hard mask thickness values. Under each figure are provided statistical data for the measurement readings Referring to FIGS. 28A and 28B, the measurements correspond to a wafer prior to etching the hard mask layers in an etching process. The mean gate height is 97.90 nm. The three-sigma range is ±3.99 nm, representing a probabilistic gate height variation of 8.2%. The overall range of measured values is 7.45 nm, representing about a 7.6% variation in gate height measured values. As for the hard mask thickness, the mean hard mask thickness is 77.77 nm. The three-sigma range is ±3.75 nm, representing a probabilistic hard mask thickness variation of 7.0%. The overall range of measured values is 3.11 nm, representing about a 4.0% variation in hard mask thickness measured values.

Figures 28A, 28B:
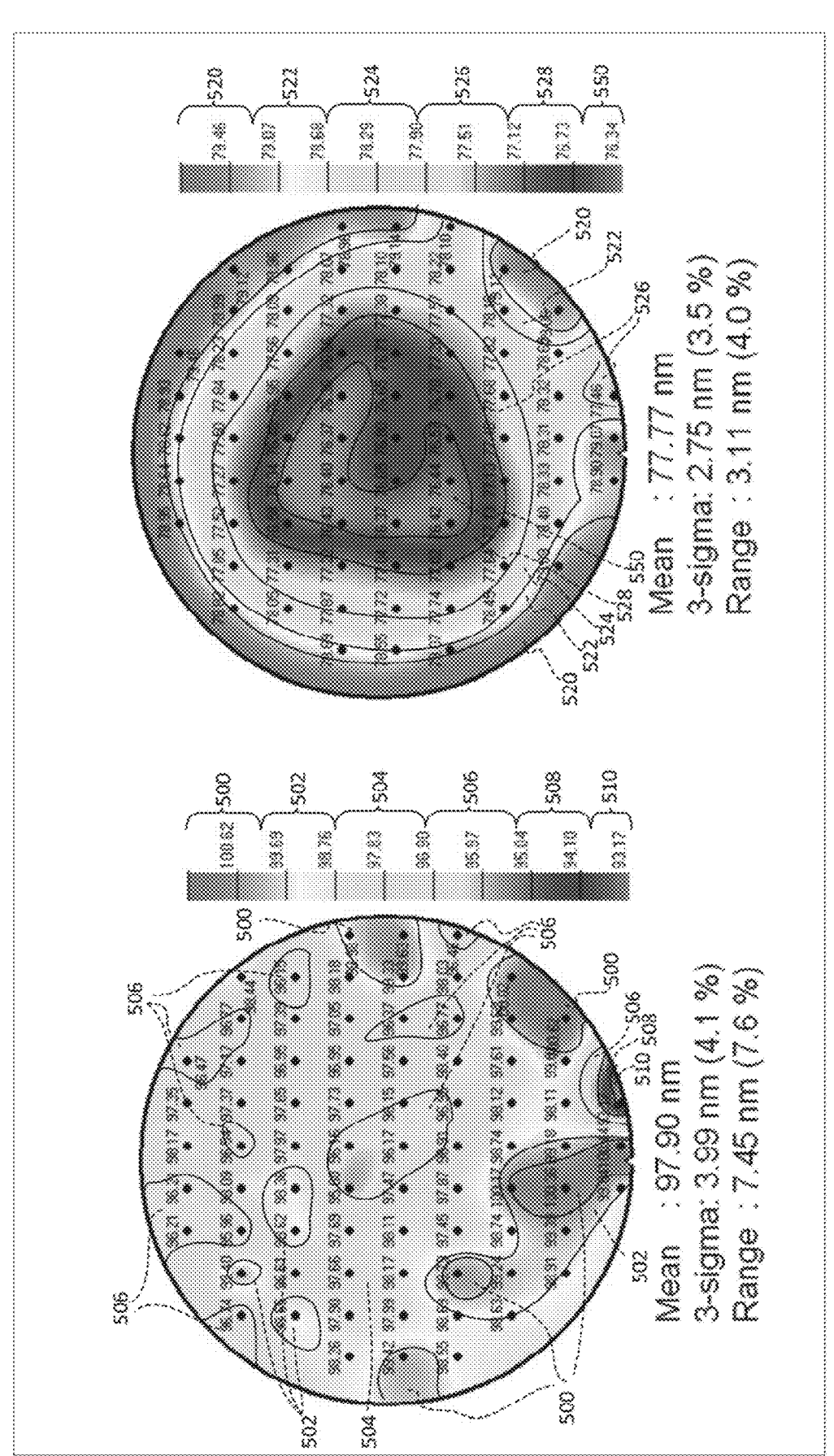

Table 2 shows a side-by-side comparison of the values of FIGS. 28A and 28B, compared to similar measurements of a wafer in a separate test without the thermal pad.

TABLE 2

|  | With Thermal Pad | | Without Thermal Pad | |
|---|---|---|---|---|
|  | Gate Height | HM Thickness | Gate Height | HM Thickness |
| Mean (nm) | 97.90 | 77.77 | 97.30 | 77.99 |
| 3-sigma (nm) | 3.99 | 2.75 | 3.97 | 2.99 |
| Range (nm) | 7.45 | 3.11 | 5.51 | 3.34 |

Figures 29A, 29B:
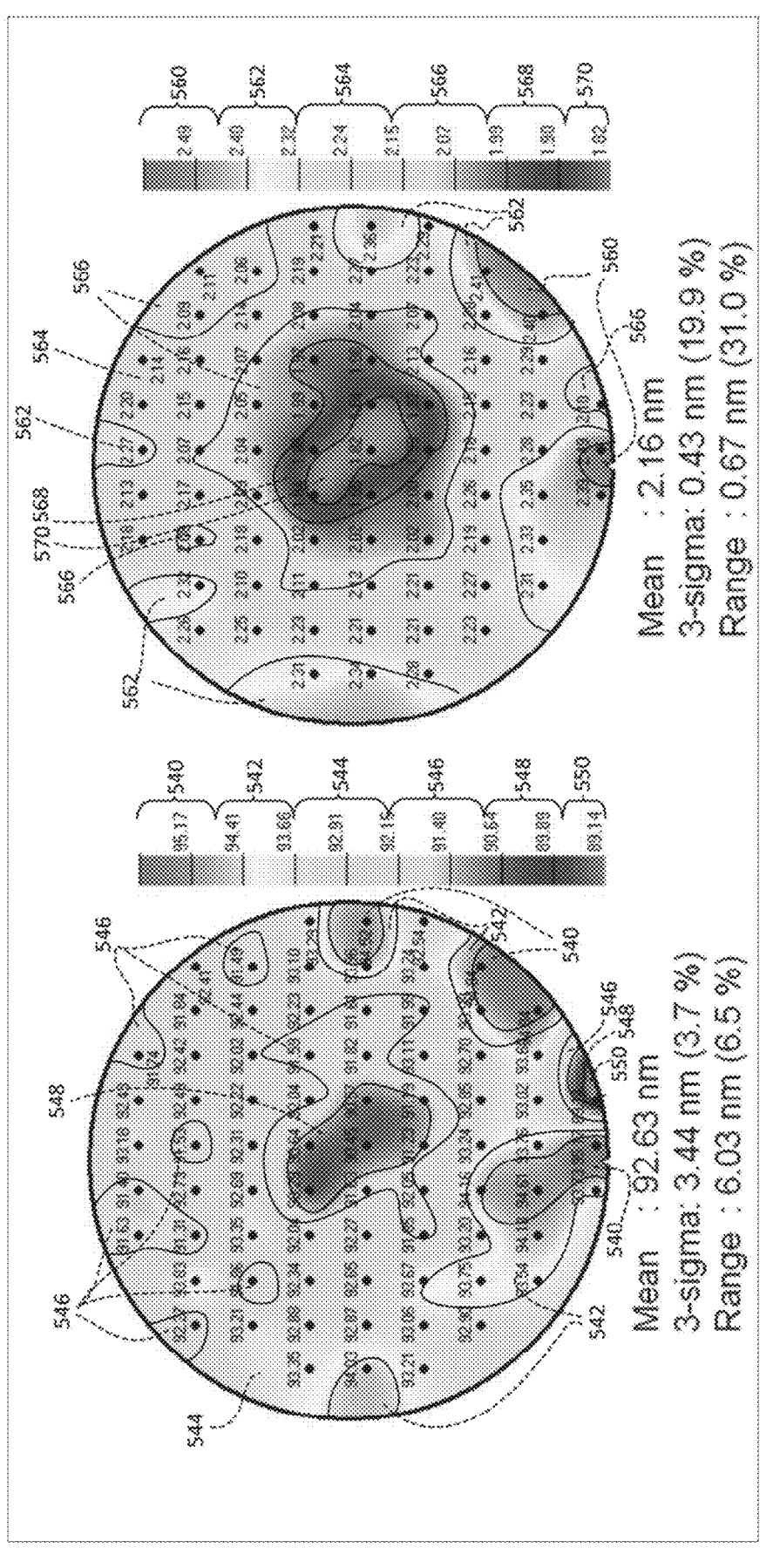

Referring to FIGS. 29A and 29B, the measurements correspond to the wafer after an etching stage to remove the hard mask. Subsequent to etching, the mean gate height is 92.63 nm. The three-sigma range is ±3.44 nm, representing a probabilistic gate height variation of 7.4%. The overall range of measured values is 6.03 nm, representing about a 6.5% variation in gate height measured values. Subsequent to etching, the mean hard mask thickness is 2.16 nm. The three-sigma range is ±0.43 nm, representing about a 39.8% probabilistic hard mask thickness variation. The overall range of measured values is 0.67 nm, representing about a 31.0% variation in hard mask thickness measured values.

Table 3 shows a side-by-side comparison of the values of FIGS. 29A and 29B, compared to similar measurements of a wafer in a separate test without the thermal pad.

TABLE 3

|  | With Thermal Pad | | Without Thermal Pad | |
|---|---|---|---|---|
|  | Gate Height | HM Thickness | Gate Height | HM Thickness |
| Mean (nm) | 92.63 | 2.16 | 93.63 | 2.47 |
| 3-sigma (nm) | 3.44 | 0.43 | 4.84 | 1.06 |
| Range (nm) | 6.03 | 0.67 | 6.67 | 2.15 |

Figures 30A, 30B:
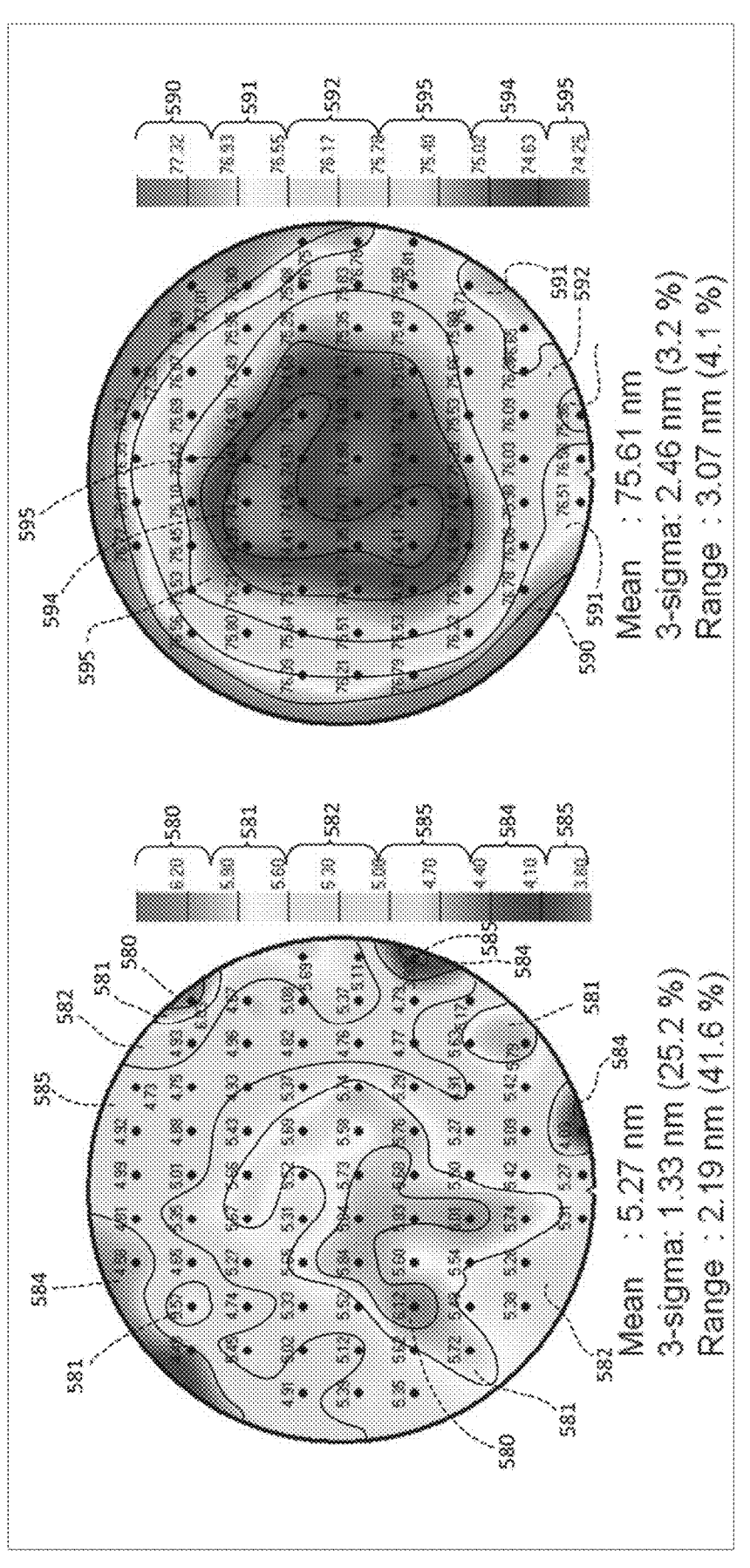

Referring to FIGS. 30A and 30B, the provided measurements correspond to the point-by-point delta between the wafer after an etching stage to remove the hard mask (FIGS. 29A and 29B) and the wafer before the etching stage (FIGS. 28A and 28B) while using the thermal pad. These values demonstrate by how much the dummy gate heights have been shortened and by how much the hard masks have been etched. The difference in the mean gate height pre- and post-etching is 5.27 nm. The three-sigma range is ±1.33 nm, representing about a 50.4% probabilistic gate height etch variation. The overall range of measured values for gate height removal is 2.19 nm, representing about a 41.6% variation in gate height measured values. Subsequent to etching, the difference in the mean hard mask thickness pre- and post-etching is 75.61 nm. The three-sigma range is ±2.46 nm, representing about a 6.4% probabilistic hard mask thickness removal variation. The overall range of measured values for hard mask removal is 3.07 nm, representing about a 4.1% variation in hard mask thickness measured values.

Table 4 shows a side-by-side comparison of the values of FIGS. 30A and 30B, compared to similar measurements of a wafer in a separate test without the thermal pad.

TABLE 4

| | With Thermal Pad | | Without Thermal Pad | |
|---|---|---|---|---|
| | Gate Height | HM Thickness | Gate Height | HM Thickness |
| Mean (nm) | 5.27 | 75.61 | 3.67 | 75.52 |
| 3-sigma (nm) | 1.33 | 2.46 | 3.23 | 2.41 |
| Range (nm) | 2.19 | 3.07 | 4.39 | 3.55 |

Without the thermal pad the range for gate height removal (corresponding to Table 4) is 4.39 nm, which is 119.6% of the mean, compared to 2.19 nm, which is 41.6% of the mean, when using the thermal pad. Thus, the gate height variation across the wafer is advantageously improved to have less variation when using the thermal pad, such as thermal pad 60.

Embodiments provide a more consistent etch rate across an entire wafer by using a thermal pad between an insert ring and electrostatic chuck. The thermal pad provides a continuous passive heat path to dissipate heat from the insert ring and wafer edge to the electrostatic chuck. In some embodiments, active cooling mechanism may be located in the electrostatic chuck. The thermal pad helps to keep the temperature of the various components in contact with or near the wafer at a more consistent temperature. Because temperature may affect etch rate, such as with etching hard masks over dummy gate formations, a more consistent etch rate is attained. Further, the benefits of the thermal pad were found to help the etch rate uniformity across the whole wafer and not just at the edge. Embodiments use the thermal pad in an etch process to perform gate replacement by removing hard mask layer(s) over a dummy gate electrode. As a result of using the thermal pad, gate height is better maintained across the etch and gate loading has less impact on gate height. After removal the hard mask, the dummy gate electrodes may be removed and replaced. Contacts can then be formed to the source/drain regions and gate electrodes.

One embodiment is an etching chamber platform that includes an electrostatic chuck, a shadow ring surrounding the electrostatic chuck, and an insert ring on a first inset step of the shadow ring. The insert ring also overlaps an inset step of the electrostatic chuck. The insert ring has a bottom inset step in a portion of the insert ring that overlaps the inset step of the electrostatic chuck. One or more thermal pads are interposed between the insert ring and the electrostatic chuck, where the one or more thermal pads are adjacent to the bottom inset step of the insert ring and the inset step of the electrostatic chuck, the one or more thermal pads having a higher thermal conductivity than the shadow ring.

One embodiment is a method that includes installing a thermal pad into an etching chamber. A stepped insert ring is installed into the etching chamber such that the thermal pad is interposed between the stepped insert ring and an electrostatic chuck of the etching chamber. The thermal pad has a higher thermal conductivity than other elements of the etching chamber in contact with the stepped insert ring.

One embodiment is a method that includes providing etchant gasses in an etching chamber, where the etching chamber has a wafer therein. A plasma is generated the etchant gasses. The plasma is used to etch structures on the wafer. Heat is dissipated from an insert ring of the etching chamber through a thermal pad to an electrostatic chuck of the etching chamber. The thermal pad has a higher heat transfer than other elements of the chamber in contact with the insert ring.

Another embodiment is a device including a wafer chuck. The device also includes an insert ring laterally surrounding the wafer chuck, the insert ring having an edge portion which is over a portion of the wafer chuck. The device also includes a thermal pad disposed between the insert ring and the wafer chuck, an upper surface of the thermal pad having a first interface with the insert ring and a lower surface of the thermal pad having a second interface with the wafer chuck.

Another embodiment is an etching device including an electrostatic chuck having a first portion wider than a second portion, the second portion being configured to support a wafer during an etching process. The etching device also includes an insert ring laterally surrounding the electrostatic chuck and vertically overlapping the first portion of the electrostatic chuck. The etching device further includes one or more thermal pads interposed between the insert ring and the electrostatic chuck, the one or more thermal pads each having a first surface in contact with the insert ring and a second surface in contact with the electrostatic chuck, the one or more thermal pads each being configured to dissipate heat from the insert ring to the electrostatic chuck.

Another embodiment is a device including a thermal pad disposed on a lower ledge of a wafer chuck, the lower ledge surrounding a bottom portion of the wafer chuck. The device also includes an insert ring disposed around the wafer chuck, the insert ring laterally surrounding the wafer chuck, the insert ring contacting an upper surface of the thermal pad, the insert ring having an upper surface level with an upper surface of the wafer chuck.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a wafer chuck;
an outer ring having an outermost surface having an outer diameter and an inner surface having an inner diameter, wherein the inner surface of the outer ring mates with a surface of the wafer chuck;
an insert ring, separate from the outer ring and having an outermost diameter that is less than the outer diameter of the outer ring, and laterally surrounding the wafer chuck, the insert ring having an edge portion which is over a portion of the wafer chuck;
a collar ring on and covering the outer ring and at least partially covering the insert ring, wherein the collar ring has a lower surface with an extension that mates with a recess in an upper surface of the outer ring, wherein at least one of the outer ring, the insert ring, and the collar ring is a different material than others of the outer ring, the insert ring, and the collar ring;
a first thermal pad disposed between the insert ring and the wafer chuck, an upper surface of the first thermal pad having a first interface with the insert ring and a lower surface of the first thermal pad having a second interface with the wafer chuck, the first thermal pad having a first innermost surface a first radial distance from a centermost point of the wafer chuck and a first outermost surface a second radial distance, greater than the first radial distance, from the centermost point of the wafer chuck, a second thermal pad disposed between the insert ring and the wafer chuck, an upper surface of the second thermal pad having a third interface with the insert ring and a lower surface of the second thermal pad having a fourth interface with the wafer chuck, the second thermal pad having a second innermost surface a third radial distance, greater than the second radial distance, from the centermost point of the wafer chuck and a second outermost surface a fourth radial distance, greater than the third radial distance from the centermost point of the wafer chuck;

a first air-filled void between the first outermost surface of the first thermal pad and the second innermost surface of the second thermal pad;

an adhesive layer, separate from the first thermal pad, providing adhesion between at least one of the first thermal pad and the second thermal pad and at least one of the insert ring and the wafer chuck;

a cathode underlying and supporting the wafer chuck;

an insulating ring underlying the outer ring, and surrounding the cathode, wherein the insulating ring has an inner surface contacting an outer surface of the cathode, and wherein the insulating ring has an upper surface including a projection, and the outer ring has a lower surface including a recess, and further wherein the projection of the insulating ring extends into and mates with the recess of the outer ring;

a first platform support member surrounding the insulating ring and underlying the outer ring; and a second platform support member surrounding the first platform support member and extending between the first platform support member and the outer ring.

2. The device of claim 1, wherein the first thermal pad is inset into the insert ring.

3. The device of claim 2, wherein a bottom surface of the insert ring is level with the lower surface of the first thermal pad.

4. The device of claim 1, further comprising a second air-filled void between the first innermost surface of the first thermal pad and a sidewall of the wafer chuck, and a third air-filled void between the second outermost surface of the second thermal pad and a sidewall of the insert ring.

5. The device of claim 1, wherein the first air-filled void has a width, measured in the radial direction, of less than 40% of the width of the edge portion of the insert ring.

6. The device of claim 1, wherein the first thermal pad comprises a metallic material having a thermal conductivity greater than a thermal conductivity of the insert ring.

7. The device of claim 1, wherein a topmost surface of the insert ring is lower than a topmost surface of the outer ring.

8. The device of claim 1, wherein the wafer chuck has a first outermost diameter and the insert ring has a second outermost diameter that is equal to the first outermost diameter.

9. An etching device comprising:

an electrostatic chuck having a first portion wider than a second portion, the second portion being configured to support a wafer during an etching process;

a shadow ring laterally surrounding the electrostatic chuck and vertically overlapping the first portion of the electrostatic chuck;

an insert ring laterally surrounding the electrostatic chuck and vertically overlapping the first portion of the electrostatic chuck, the insert ring having an outermost diameter that is less than a diameter of an inner surface of the shadow ring, the insert ring forming an interface with the shadow ring, wherein the insert ring has a first thickness, measured from topmost surface to bottommost surface at a first point where the insert ring overlaps the shadow ring, has a second thickness less than the first thickness at a second point inside an innermost surface of the shadow ring, and has a third thickness less than the second thickness at an innermost surface of the insert ring;

a collar ring on and covering the shadow ring and at least partially covering the insert ring, wherein the collar ring has a nominal bottommost surface and a projection extending from the nominal bottommost surface, the shadow ring has a nominal topmost surface and a recess extending into the nominal topmost surface, and wherein the projection extends into and mates with the recess, and further wherein at least one of the shadow ring, the insert ring, and the collar ring is a different material than others of the shadow ring, the insert ring, and the collar ring;

one or more thermal pads interposed between the insert ring and the electrostatic chuck, the one or more thermal pads each having a first surface in contact with the insert ring and a second surface in contact with the electrostatic chuck, the one or more thermal pads each being configured to dissipate heat from the insert ring to the electrostatic chuck and being arranged as a series of concentric rings, the concentric rings of the one or more thermal pads being separated in the radial direction of the concentric rings, one from the other, by air-filled voids;

a cathode underlying and supporting the wafer chuck;

an insulating ring underlying the outer ring, and surrounding the cathode, wherein the insulating ring has an inner surface contacting an outer surface of the cathode, and wherein the insulating ring has an upper surface including a projection, and the outer ring has a lower surface including a recess, and further wherein the projection of the insulating ring extends into and mates with the recess of the outer ring;

a first platform support member surrounding the insulating ring and underlying the outer ring; and a second platform support member surrounding the first platform support member and extending between the first platform support member and the outer ring.

10. The etching device of claim 9, wherein the insert ring includes a stepped portion in a bottom surface thereof, the one or more thermal pads being disposed in the stepped portion of the insert ring.

11. The etching device of claim 9, wherein:
the shadow ring has a bottom step portion supporting the insert ring.

12. The etching device of claim 9, further comprising:
a void disposed between a third surface of the one or more thermal pads and the electrostatic chuck or a void disposed between a fourth surface of the one or more thermal pads and the insert ring.

13. The etching device of claim 9, further comprising: at least two thermal pads; and
a void disposed between the at least two thermal pads.

14. The etching device of claim 13, wherein the at least two thermal pads are disposed in a ringed configuration.

15. The etching device of claim 9, wherein the one or more thermal pads comprises a metallic filler material and has a thermal conductivity greater than a thermal conductivity of the insert ring.

16. The etching device of claim 9, wherein the one or more thermal pads have respective portions which are configured to overlap the second portion of the electrostatic chuck.

17. The etching device of claim 9, wherein the insert ring has a surface which is level with an upper surface of the electrostatic chuck.

18. A device comprising:

a thermal pad disposed on a lower ledge of a wafer chuck and adhered to the lower edge of the wafer chuck by an adhesive material separate from the thermal pad, the lower ledge surrounding a bottom portion of the wafer chuck;

an insert ring disposed around the wafer chuck, the insert ring laterally surrounding the wafer chuck, the insert ring having a lower surface contacting an upper surface of the thermal pad, the insert ring having an upper surface level with an upper surface of the wafer chuck, wherein the upper surface of the insert ring has a first length in a direction parallel to a radius line of the wafer chuck and the lower surface of the insert ring has second length greater than the first length in the direction parallel to the radius line of the wafer chuck, wherein a lower surface and a first sidewall surface of the insert ring and an upper surface and a second sidewall surface of the wafer chuck define an enclosed cavity, and further wherein the thermal pad fills the enclosed cavity in a vertical direction while leaving one or more portions of the enclosed cavity in a horizontal direction unfilled by the thermal pad, the one more portions of the enclosed cavity in the horizontal direction being filled with air or helium, and further wherein the insert ring is detachably connected to the thermal pad;

a shadow ring surrounding the insert ring and extending partially thereunder; and a collar ring overlying and covering the shadow ring and at least partially covering the insert ring, wherein at least one of the shadow ring, the insert ring, and the collar ring is a different material than others of the shadow ring, the insert ring, and the collar ring;

a cathode underlying and supporting the wafer chuck;

an insulating ring underlying the outer ring, and surrounding the cathode, wherein the insulating ring has an inner surface contacting an outer surface of the cathode, and wherein the insulating ring has an upper surface including a projection, and the outer ring has a lower surface including a recess, and further wherein the projection of the insulating ring extends into and mates with the recess of the outer ring;

a first platform support member surrounding the insulating ring and underlying the outer ring; and a second platform support member surrounding the first platform support member and extending between the first platform support member and the outer ring.

19. The device of claim 18, wherein the thermal pad is inset into the insert ring, the insert ring having a bottommost surface lower than the upper surface of the thermal pad.

20. The device of claim 18, wherein the wafer chuck comprises heat dissipation features, the heat dissipation features configured to remove heat from the thermal pad.

\*    \*    \*    \*    \*